(12) United States Patent
Yang et al.

(10) Patent No.: US 11,605,680 B2
(45) Date of Patent: Mar. 14, 2023

(54) DISPLAY DEVICE

(71) Applicant: LG Display Co., Ltd., Seoul (KR)

(72) Inventors: YuCheol Yang, Paju-si (KR); Suhyeon Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 170 days.

(21) Appl. No.: 16/582,981

(22) Filed: Sep. 25, 2019

(65) Prior Publication Data
US 2020/0105845 A1   Apr. 2, 2020

(30) Foreign Application Priority Data

Sep. 28, 2018  (KR) .......................... 10-2018-0116080

(51) Int. Cl.
*H01L 27/00* (2006.01)
*H01L 51/52* (2006.01)
*H01L 27/32* (2006.01)
*H01L 51/56* (2006.01)
*H01L 29/66* (2006.01)

(52) U.S. Cl.
CPC .... *H01L 27/3246* (2013.01); *H01L 29/66833* (2013.01); *H01L 51/56* (2013.01); *H01L 2227/323* (2013.01)

(58) Field of Classification Search
CPC ............. H01L 27/3246; H01L 27/3272; H01L 27/3295; H01L 27/3297; H01L 51/5044; H01L 51/525; H01L 27/3209; H01L 27/3218
See application file for complete search history.

(56) References Cited

U.S. PATENT DOCUMENTS

| | | | | |
|---|---|---|---|---|
| 8,049,413 B2* | 11/2011 | Kumagai | ............ | H01L 27/3246 313/504 |
| 8,393,930 B2* | 3/2013 | Kang | .................. | H01L 51/5203 445/24 |
| 9,087,964 B2* | 7/2015 | Hatano | .................... | H01L 33/36 |
| 9,735,212 B2* | 8/2017 | Pang | .................... | H01L 27/3248 |
| 10,361,257 B2* | 7/2019 | Yang | ..................... | H01L 51/56 |
| 10,811,478 B2* | 10/2020 | Choi | ................... | H01L 27/3246 |
| 2003/0030766 A1* | 2/2003 | Kiguchi | ............. | H01L 27/3246 349/106 |
| 2004/0113550 A1* | 6/2004 | Adachi | ............... | H01L 27/3262 313/512 |

(Continued)

FOREIGN PATENT DOCUMENTS

| | | |
|---|---|---|
| JP | 2004127933 A | 4/2004 |
| JP | 2004253383 A | 9/2004 |

(Continued)

*Primary Examiner* — Mary A Wilczewski
*Assistant Examiner* — Tsz K Chiu
(74) *Attorney, Agent, or Firm* — Seed IP Law Group LLP

(57) ABSTRACT

A display device includes: a substrate having thereon a first subpixel, a second subpixel, and a third subpixel; a first electrode in each of the first to third subpixels on the substrate; a first bank between the first electrodes; a second bank on the first bank and having a width less than that of the first bank; a light emitting layer on the first electrodes, the first bank, and the second bank; and a second electrode on the light emitting layer. The light emitting layer provided on the second bank and the light emitting layer provided on the first bank are spaced apart from each other.

18 Claims, 15 Drawing Sheets

(56) References Cited

U.S. PATENT DOCUMENTS

| | | | |
|---|---|---|---|
| 2005/0140303 A1 | 6/2005 | Lee et al. | |
| 2007/0263164 A1* | 11/2007 | Kumagai | H01L 51/0012 349/156 |
| 2009/0009069 A1* | 1/2009 | Takata | H01L 27/3246 445/24 |
| 2010/0193791 A1* | 8/2010 | Chun | H01L 27/3246 438/34 |
| 2014/0035456 A1 | 2/2014 | Isa | |
| 2014/0103368 A1 | 4/2014 | Hatano et al. | |
| 2015/0070374 A1* | 3/2015 | Gong | G02F 1/134309 345/589 |
| 2016/0043161 A1 | 2/2016 | Miyazawa | |
| 2016/0079325 A1 | 3/2016 | Lee et al. | |
| 2018/0033841 A1* | 2/2018 | Yang | H01L 51/0003 |
| 2018/0151647 A1* | 5/2018 | Lee | H01L 27/124 |
| 2019/0165068 A1* | 5/2019 | Park | H01L 51/5284 |
| 2020/0035758 A1* | 1/2020 | Kang | H01L 51/5218 |

FOREIGN PATENT DOCUMENTS

| | | | | |
|---|---|---|---|---|
| JP | 2005197228 A | | 7/2005 | |
| JP | 2007305357 A | * | 11/2007 | ......... H01L 27/3246 |
| JP | 2014044938 A | | 3/2014 | |
| JP | 2014082133 A | | 5/2014 | |
| JP | 2016039029 A | | 3/2016 | |
| KR | 10-2017-0080306 A | | 7/2017 | |

\* cited by examiner

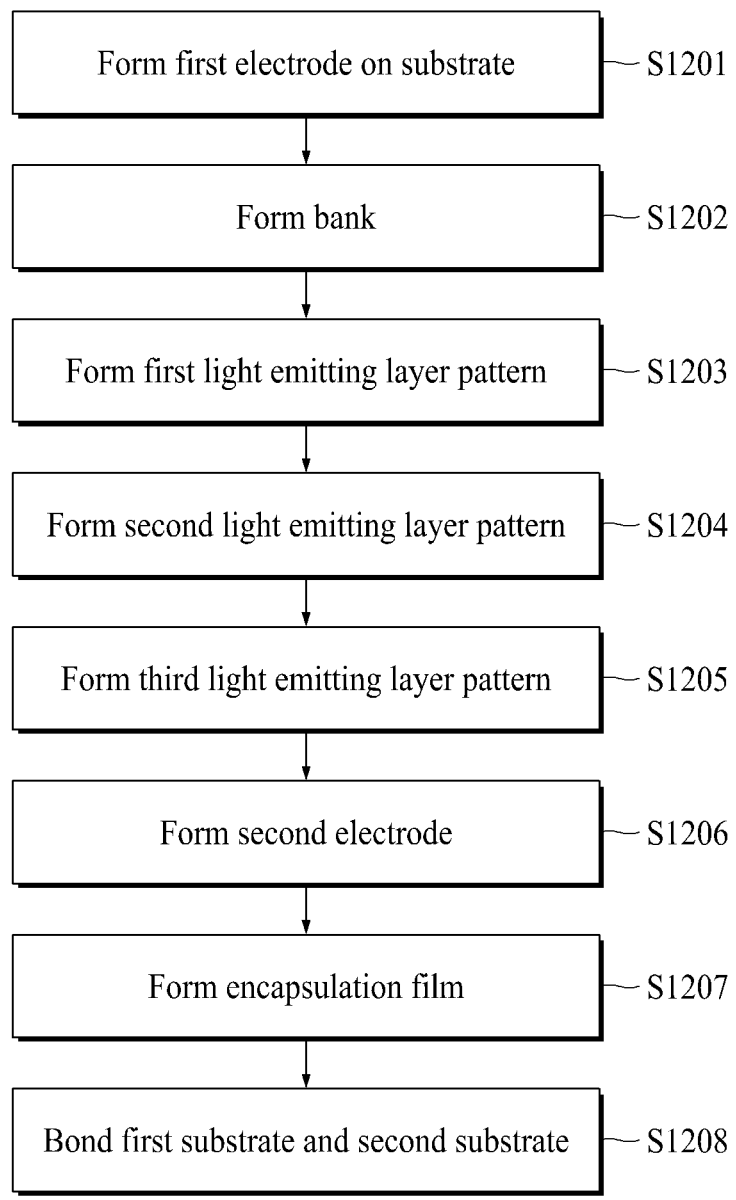

DISPLAY DEVICE

CROSS-REFERENCE TO RELATED APPLICATIONS

This application claims the benefit of and priority to Korean Patent Application No. 10-2018-0116080, filed on Sep. 28, 2018, which is hereby incorporated by reference in its entirety as if fully set forth herein.

BACKGROUND

Technical Field

The present disclosure relates to a display device that displays an image.

Description of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device have been widely utilized.

An OLED device out of such display devices employs a spontaneous emission system, has a wide viewing angle, a high contrast ratio, and the like which are more excellent than those of an LCD device, and can be decreased in weight and thickness and is advantageous in power consumption because a separate backlight is not required. An OLED device can be driven with a DC low voltage, has a high response speed, and has low manufacturing costs.

In such an OLED device, a light emitting layer is formed in patterns for each subpixel using a photolithography process. In the OLED device, there is a problem in that the light emitting layer is damaged through the photolithography process and a lifespan and efficiency thereof may decrease.

BRIEF SUMMARY

The present disclosure provides a display device that can reduce or minimize damage of a light emitting layer.

According to an embodiment of the present disclosure, there is provided a display device including: a substrate that includes a first subpixel, a second subpixel, and a third subpixel; a first electrode that is provided in each of the first to third subpixels on the substrate; a first bank that is provided between the first electrodes; a second bank that is provided on the first bank and has a width less than that of the first bank; a light emitting layer that is provided on the first electrodes, the first bank, and the second bank; and a second electrode that is provided on the light emitting layer. The light emitting layer provided on the second bank and the light emitting layer provided on the first bank on which the second bank is not provided are separated from each other.

According to another embodiment of the present disclosure, there is provided a display device including: a substrate that includes a plurality of pixels of which each includes a first subpixel, a second subpixel, and a third subpixel; a first electrode that is provided in each of the first to third subpixels on the substrate; a first bank that is provided between the first electrodes; a second bank that is provided on the first bank; a light emitting layer that is provided on the first electrodes, the first bank, and the second bank; and a second electrode that is provided on the light emitting layer. The first subpixel, the second subpixel, and the third subpixel which are included in each of the plurality of pixels have different shapes.

According to the present disclosure, the light emitting layer provided on the second bank and the light emitting layer provided on the first bank on which the second bank is not provided can be separated from each other by forming the second bank on the first bank. Accordingly, with the display device according to the present disclosure, it is possible to reduce or minimize damage of the light emitting layer in the photolithography processes.

According to the present disclosure, it is possible to reduce the number of times of exposure of the light emitting layer provided in each subpixel in the course of performing a plurality of photolithography processes by forming the subpixels such that one subpixel surrounds another subpixel. Accordingly, with the display device according to the present disclosure, it is possible to reduce or minimize damage of the light emitting layer in the photolithography processes.

In addition to the above-mentioned advantageous effects of the present disclosure, other features and advantages of the present disclosure will be described below or can be clearly understood by those skilled in the art from such description or explanation.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIG. 12 is a flowchart illustrating a method of manufacturing a display device according to an embodiment of the present disclosure;

DETAILED DESCRIPTION

Figure 1:
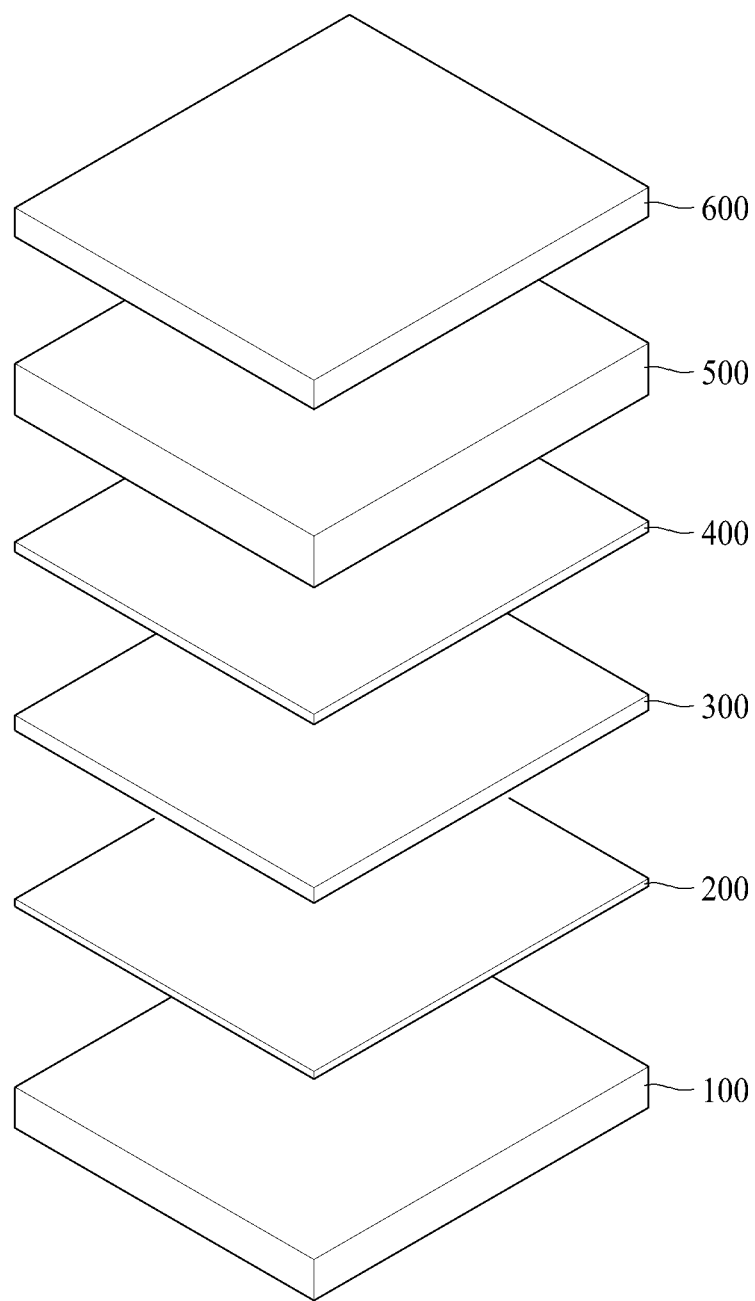
FIG. 1 is a perspective view schematically illustrating a display device according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus the present disclosure is not limited to the illustrated details. Like reference numerals refer to like elements throughout. In the following description, when the detailed description of the relevant known technology is determined to unnecessarily obscure the important point of the present disclosure, the detailed description will be omitted. In a case where 'comprise,' 'have,' and 'include' described in the present disclosure are used, another part may be added unless 'only~' is used. The terms of a singular form may include plural forms unless referred to the contrary.

In construing an element, the element is construed as including an error range although there is no explicit description.

In describing a positional relationship, for example, when a position relation between two parts is described as 'on~', 'over~', 'under~', and 'next~', one or more other parts may be disposed between the two parts unless 'just' or 'direct' is used.

It will be understood that, although the terms "first," "second,", etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

Terms such as first and second can be used to describe elements of the present disclosure. These terms are only used to distinguish one element from another element, and essentials, sequences, orders, or numbers of the elements are not limited by the terms. When an element is described as being "connected," "coupled," or "linked" to another element, it should be understood that the element may be connected or coupled directly to another element, still another element may be "interposed" between the elements, or the elements may be "connected," "coupled," or "linked" to each other via still another element.

Features of various embodiments of the present disclosure may be partially or totally coupled to or combined with each other, and may be variously inter-operated and driven technically. The embodiments of the present disclosure may be carried out independently from each other or may be carried out together with a co-dependent relationship.

Hereinafter, examples of a display device according to the present disclosure will be described in detail with reference to the accompanying drawings. In the drawings, the same elements will be referred to by the same reference signs as much as possible.

First Embodiment

Figure 2:
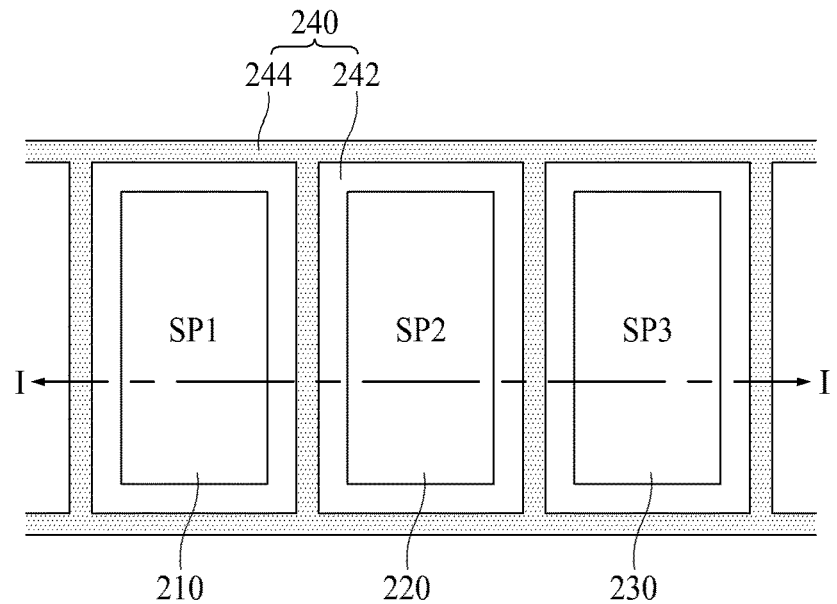
FIG. 2 is a plan view schematically illustrating subpixels according to a first embodiment of the present disclosure.
Figure 3:
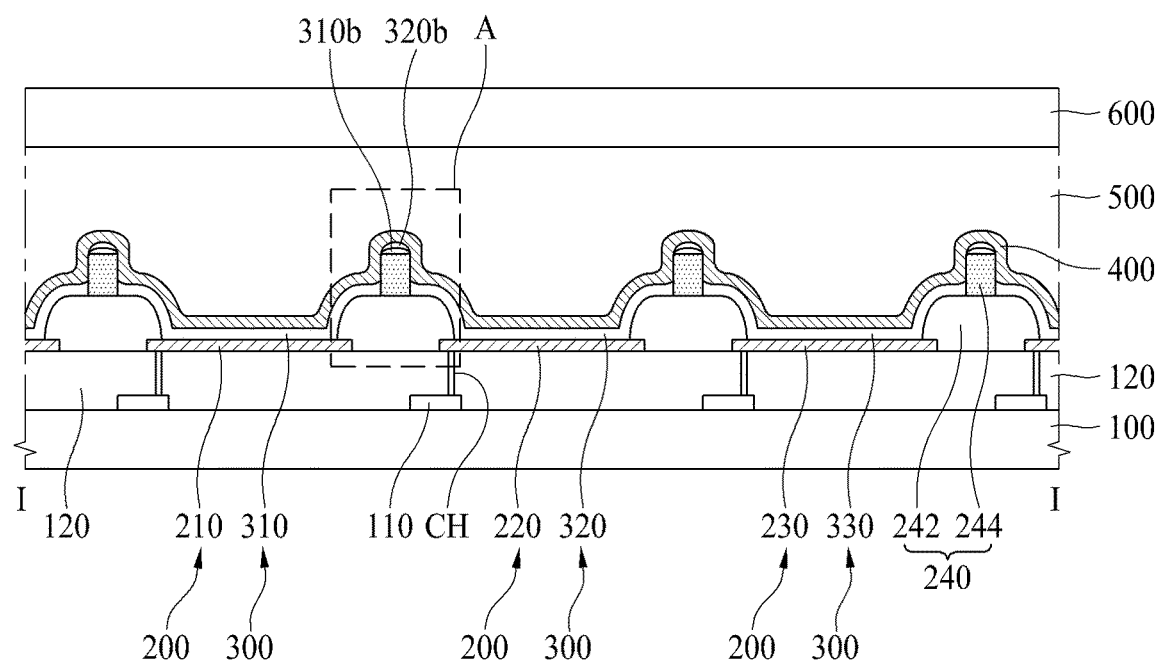
FIG. 3 is a sectional view taken along line I-I in FIG. 2.
Figure 4:
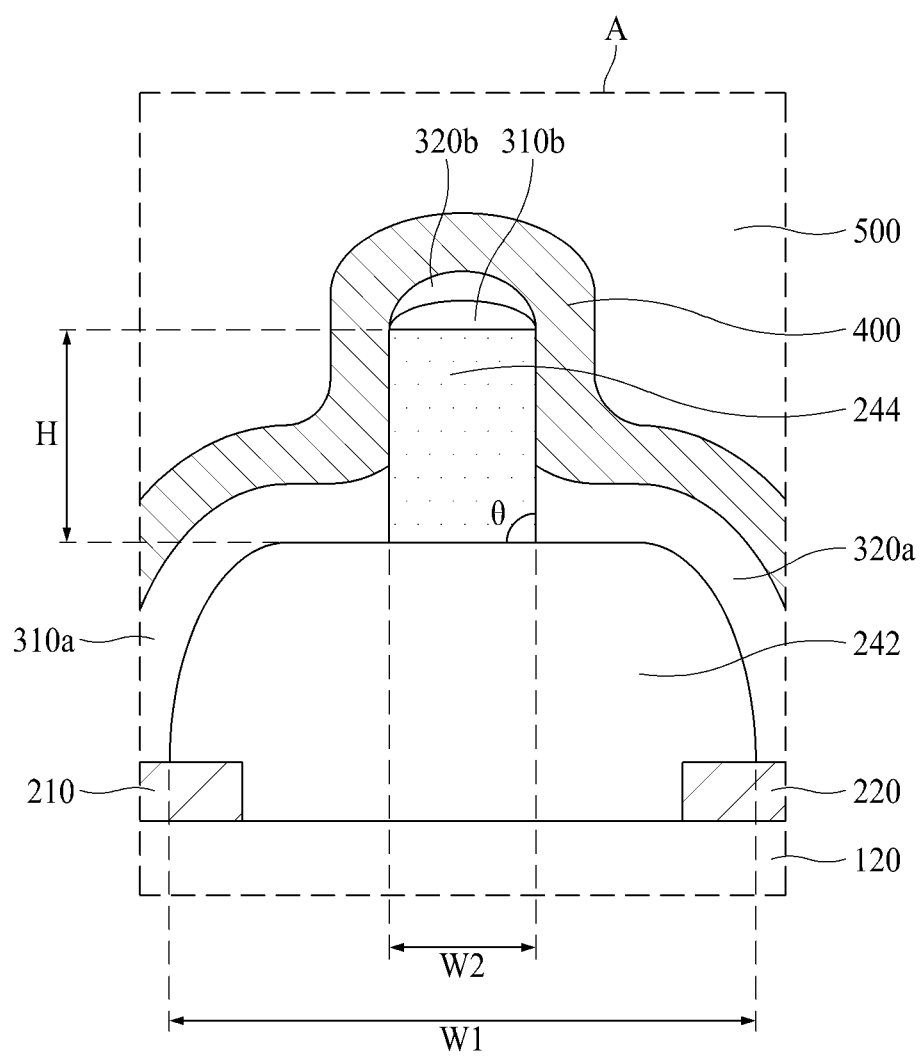
FIG. 4 is an enlarged view illustrating an example of area A.
Figure 5:
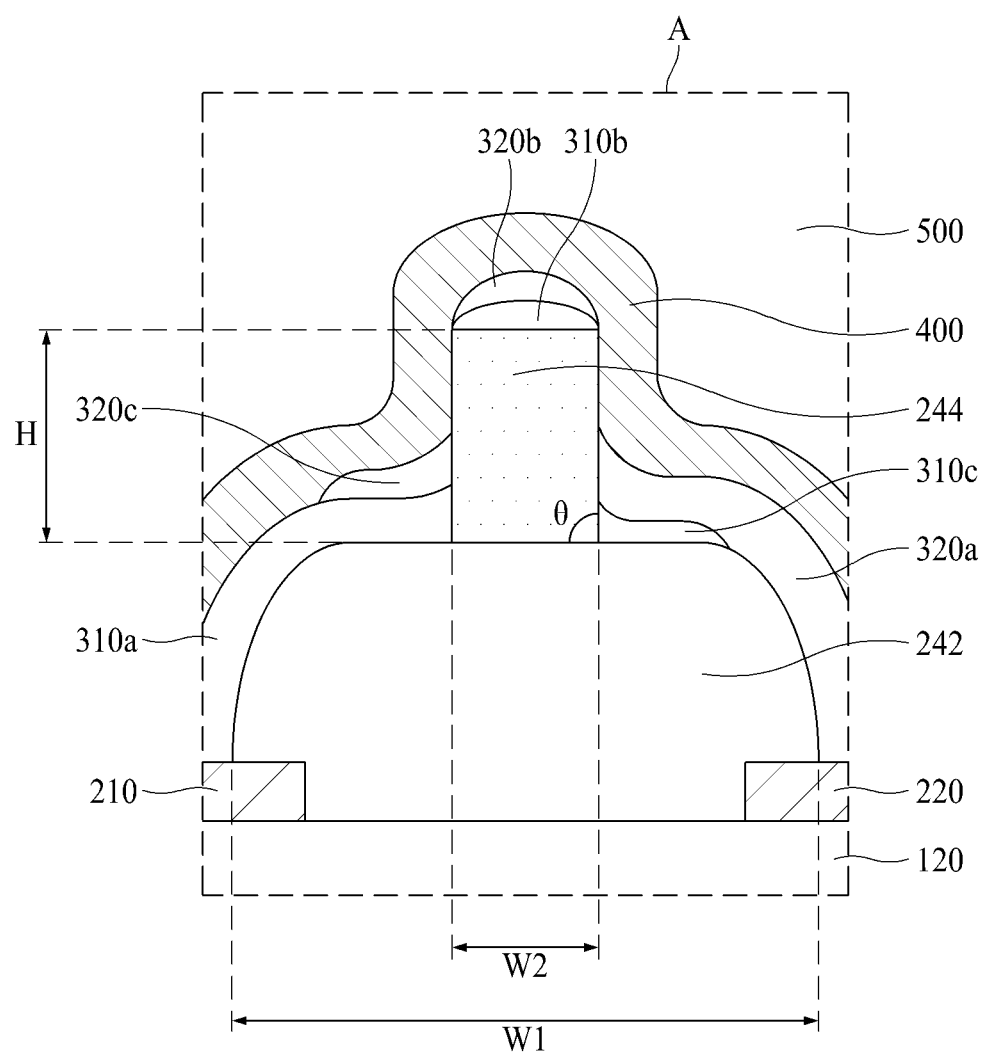
FIG. 5 is an enlarged view illustrating another example of area A in FIG. 3.
Figure 6:
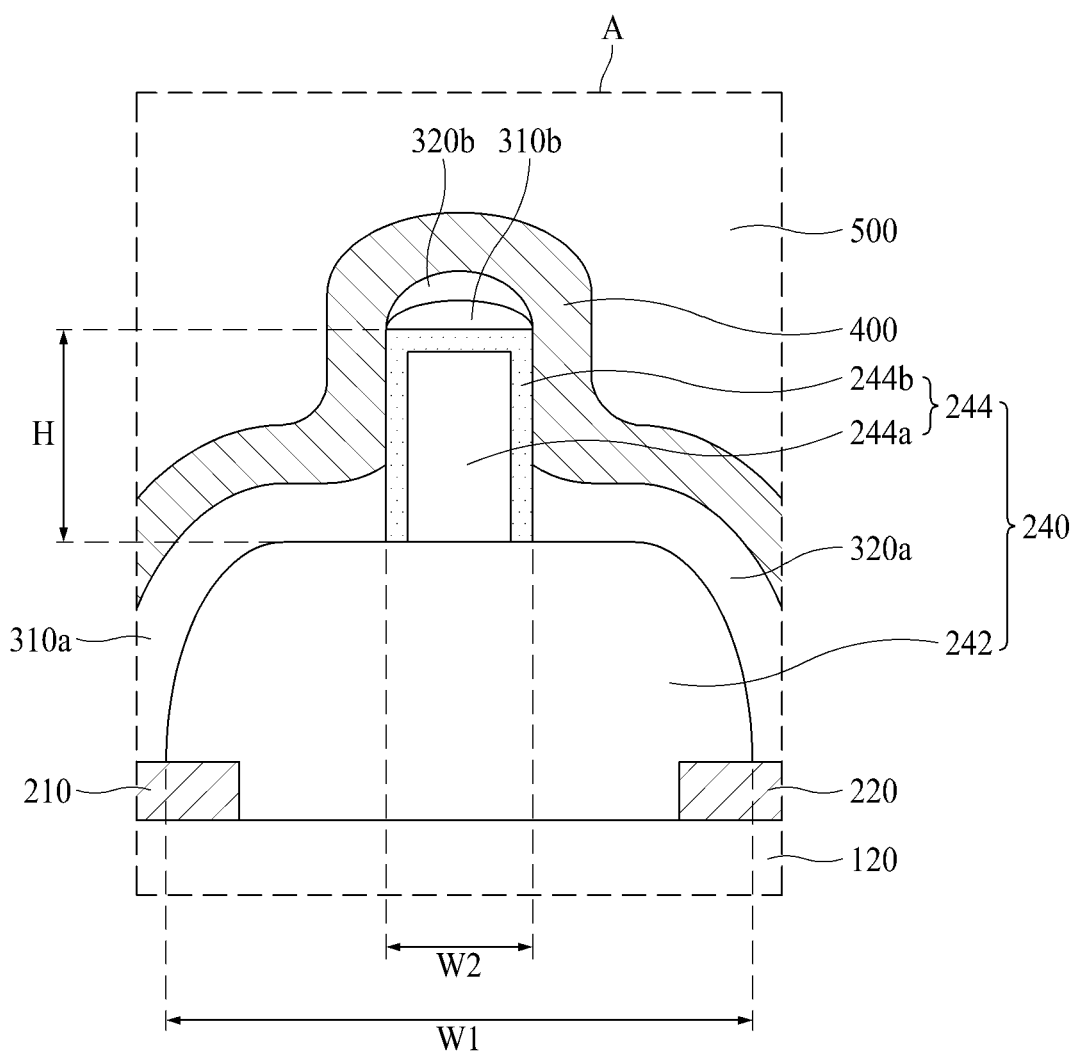
FIG. 6 is an enlarged view illustrating still another example of area A in FIG. 3.

FIG. 1 is a perspective view schematically illustrating a display device according to an embodiment of the present disclosure. FIG. 2 is a plan view schematically illustrating subpixels according to a first embodiment of the present disclosure. FIG. 3 is a sectional view taken along line I-I in FIG. 2. FIG. 4 is an enlarged view illustrating an example of area A in FIG. 3. FIG. 5 is an enlarged view illustrating another example of area A in FIG. 3. FIG. 6 is an enlarged view illustrating still another example of area A in FIG. 3.

Referring to FIGS. 1, 2, and 3, a display device according to a first embodiment of the present disclosure includes a first substrate 100, a driving thin-film transistor 110, an insulating film 120, a first electrode 200, a bank 240, a light emitting layer 300, a second electrode 400, an encapsulation film 500, and a second substrate 600.

The first substrate 100 is formed of glass or plastic, but the present disclosure is not limited thereto and the first substrate 100 may be formed of a semiconductor material such as a silicon wafer. The first substrate 100 may be formed of a transparent material or may be formed of an opaque material. A first subpixel SP1, a second subpixel SP2, and a third subpixel SP3 is provided on the first substrate 100. In one embodiment, the first subpixel SP1 emits red light, the second subpixel SP2 emits green light, and the third subpixel SP3 emits blue light, but the present disclosure is not limited thereto. In further embodiments, a fourth subpixel that emits white (W) light may be further provided on the first substrate 100. The arrangement order of the first to third subpixels SP1, SP2, and SP3 is not particularly limited.

A display device according to the embodiment of the present disclosure employs a so-called top emission system in which emitted light is discharged to the top side, and thus an opaque material as well as a transparent material can be used as the material of the first substrate 100. In other embodiments, other emission types such as bottom emission system may be employed. In these embodiments, the material of the first substrate 100 may change to a different material so that the light may be emitted towards the bottom direction.

Circuit elements including various signal lines, thin-film transistors, and capacitors are provided on the first substrate 100 for each of the subpixels SP1, SP2, and SP3. The signal lines include a gate line, a data line, a power supply line, and a reference line. The thin-film transistors include a switching thin-film transistor, a driving thin-film transistor 110, and a sensing thin-film transistor.

The switching thin-film transistor is switched in accordance with a gate signal which is supplied via the gate line, and serves to supply a data voltage which is supplied from the data line to the driving thin-film transistor.

The driving thin-film transistor 110 is switched in accordance with the data voltage which is supplied from the switching thin-film transistor, and serves to generate a data current from a power supplied via the power supply line and to supply the generated data current to the first electrodes 210, 220, and 230.

The sensing thin-film transistor serves to sense a threshold voltage deviation of the driving thin-film transistor causing degradation in image quality, and supplies a current of the driving thin-film transistor to the reference line in response to a sensing control signal which is supplied from the gate line or a particular sensing line.

The capacitor serves to hold the data voltage which is supplied to the driving thin-film transistor 110 during one frame and is connected to the gate terminal and the source terminal of the driving thin-film transistor 110.

The insulating film 120 is provided on the circuit elements including the driving thin-film transistor 110. The insulating film 120 is formed of an inorganic film such as a silicon oxide film (SiOx), a silicon nitride film (SiNx), or a multi-layered film thereof.

A contact hole CH is provided in the insulating film 120 for each of the subpixels SP1, SP2, and SP3. The source terminal or the drain terminal of the driving thin-film transistor 110 is exposed through the contact hole CH. The contact hole CH is provided in a non-emission area which overlaps the bank 400 as illustrated in the drawing, but the present disclosure is not limited thereto. The contact hole CH may be provided in an emission area which does not overlap the bank 400.

The first electrode 200 is provided in patterns on the insulating film 120 for each of the subpixels SP1, SP2, and SP3. One first electrode 210 is provided in the first subpixel SP1, another first electrode 220 is provided in the second subpixel SP2, and still another first electrode 230 is provided in the third subpixel SP3.

The first electrodes 210, 220, and 230 are connected to the corresponding driving thin-film transistors 110. Specifically, the first electrodes 210, 220, and 230 are connected to the source terminal or the drain terminal of the corresponding driving thin-film transistor 110 via the corresponding contact hole CH which is provided in the insulating film 120.

The first electrodes 210, 220, and 230 are formed of a metal material having high reflectance such as silver (Ag) or may be formed of a metal material having high reflectance such as a stacked structure (Ti/Al/Ti) of aluminum (Al) and titanium (Ti), a stacked structure (ITO/Al/ITO) of aluminum (Al) and ITO, an APC alloy, and a stacked structure (ITO/APC/TIO) of an APC alloy and ITO. The APC alloy is an alloy of silver (Ag), palladium (Pd), and copper (Cu).

The light emitting layer 300 is provided on the first electrodes 210, 220, and 230. The light emitting layer 300 can also be provided on the bank 240. That is, the light emitting layer 300 is provided in the subpixels SP1, SP2, and SP3 and boundary areas therebetween.

The light emitting layer 300 includes a hole transporting layer, a light emitting layer, and an electron transporting layer. In this case, when a voltage is applied to the first electrodes 210, 220, and 230 and the second electrode 400, holes and electrons move to the light emitting layer via the hole transporting layer and the electron transporting layer, respectively, and are combined in the light emitting layer to form excitons and emit light.

The light emitting layer 300 includes a first light emitting layer 310, a second light emitting layer 320, and a third light emitting layer 330 which are provided in patterns at the subpixels SP1, SP2, and SP3. The first light emitting layer 310 that emits light of a first color is provided in patterns in the first subpixel SP1, the second light emitting layer 320 that emits light of a second color is provided in patterns in the second subpixel SP2, and the third light emitting layer 330 that emits light of a third color is provided in patterns in the third subpixel SP3. Here, the light of a first color is red light, the light of a second color is green light, and the light of a third color is blue light, but the present disclosure is not limited thereto. The second electrode 400 may further include a fourth light emitting layer (not illustrated) that emits white light in a fourth subpixel (not illustrated).

The second electrode 400 is provided on the light emitting layer 300. The second electrode 400 may be a common layer which is formed commonly to the subpixels SP1, SP2, and SP3. The second electrode 400 may be formed of a transparent conductive material (TCO) such as ITO or IZO that can transmit light or a semi-transmissive conductive material such as magnesium (Mg), silver (Ag), or an alloy of magnesium (Mg) and silver (Ag).

The bank 240 is provided on the insulating film 120. The bank 240 is formed in a matrix structure in boundaries between a plurality of subpixels SP1, SP2, and SP3 to form emission areas of the plurality of subpixels SP1, SP2, and SP3. That is, an exposed area of the first electrode 210, 220, or 230 which is not covered by the bank 240 but is exposed in each of the subpixels SP1, SP2, and SP3 serves as an emission area.

The bank 240 includes a first bank 242 and a second bank 244.

The first bank 242 is provided between the first electrodes 210, 220, and 230. Here, the first bank 242 is provided to cover ends of the first electrodes 210, 220, and 230. Accordingly, it is possible to prevent a problem in that a current is concentrated on the ends of the first electrodes 210, 220, and 230 to decrease emission efficiency.

The first bank 242 is formed of an inorganic film such as a silicon oxide film (SiOx), a silicon nitride film (SiNx), or a multilayered film thereof, but the present disclosure is not limited thereto. The first bank 242 may be formed of an organic material such as an acryl resin, an epoxy resin, a phenolic resin, a polyamide resin, or a polyimide resin.

In one embodiment, the first bank 242 is formed of an inorganic film to prevent damage in the course of the manufacturing process. Specifically, in the display device, the light emitting layer 300 is formed after the bank 240 has been formed. At this time, the light emitting layer 300 is formed for each subpixel using photolithography. The photolithography includes a process of forming a shield layer, a process of applying a photoresist, an exposure process, a developing process, an etching process, and a removal process. When the photolithography process progresses, a part of the first bank 242 may be exposed and the exposed first bank 242 may be damaged. In the display device according to the embodiment of the present disclosure, damage of the first bank 242 can be reduced or minimized by forming the first bank 242 out of an inorganic material.

The second bank 244 is provided on the first bank 242. In the display device according to the embodiment of the present disclosure, damage of the light emitting layers 310, 320, and 330 is reduced or minimized using the second bank 244 in the photolithography process for forming the light emitting layer 300.

More specifically, the second bank 244 has a sufficient height such that the light emitting layers 310, 320, and 330 which are provided on the second bank 244 and the light emitting layers 310, 320, and 330 which are provided on the first bank 242 on which the second bank 244 is not provided can be separated from each other at the time of deposition of the light emitting layers 310, 320, and 330. For example, the height H of the second bank 244 may be equal to or greater than 3000 Å.

In one or more embodiments, in the second bank 244, an angle formed by the bottom surface of the second bank 244 in contact with the first bank 242 and the side surface thereof may be equal to or greater than 90 degrees. That is, the second bank 244 has a right-angled structure or an inverse taper structure.

In other embodiments, the angle formed by the bottom surface of the second bank 244 in contact with a top surface the first bank 242 and the side surface of the second bank 244 may be an acute angle. That is, in some embodiments, the second bank 244 has a taper structure.

As illustrated in FIG. 2, the second bank 244 is provided adjacent to each of the first subpixel SP1, the second subpixel SP2, and the third subpixel SP3. For example, the second bank 244 may surround (or laterally surround) each of the first subpixel SP1, the second subpixel SP2, and the third subpixel SP3.

In the display device according to the embodiment of the present disclosure, the light emitting layers 310, 320, and 330 which are provided on the second bank 244 and the light emitting layers 310, 320, and 330 which are provided on the first bank 242 on which the second bank 244 is not provided can be separated from each other due to the second bank 244 which has been provided as described above.

As illustrated in FIG. 4, the first light emitting layer 310 includes a light emitting portion 310a that is provided between the first electrode 210 and the second electrode 400 and includes an emission area emitting light and a first light non-emitting portion 310b that is provided on the second bank 244 and does not emit light. Here, in the first light emitting layer 310, the light emitting portion 310a and the first light non-emitting portion 310b are separated from each other due to the second bank 244.

In a first photolithography process of forming the first light emitting layer 310, a shield layer is applied onto the first light emitting layer 310 and then a photoresist is applied thereon in order to prevent damage of the first light emitting layer 310. When the shield layer is applied onto the first light emitting layer 310 in this way, the top surface of the first light emitting layer 310 is covered by the shield layer but the side surface of the first light emitting layer 310, particularly, the side surface of the first light non-emitting portion 310b, is exposed. When the photolithography process progresses, the side surface of the first light non-emitting portion 310b can be damaged. In the display device according to the embodiment of the present disclosure, since the light emitting portion 310a and the first light non-emitting portion 310b of the first light emitting layer 310 are separated from each other, the first light non-emitting portion 310b may be damaged but the damage does not diffuse into the light emitting portion 310a.

On the other hand, as illustrated in FIG. 5, the first light emitting layer 310 may include a light emitting portion 310a that is provided between the first electrode 210 and the second electrode 400 and includes an emission area emitting light, a first light non-emitting portion 310b that is provided on the second bank 244 and does not emit light, and a second light non-emitting portion 310c that is provided on the first bank 242 on which the second bank 244 is not formed and does not emit light. In the first light emitting layer 310, the light emitting portion 310a and the first light non-emitting portion 310b are separated from each other or the first light non-emitting portion 310b and the second light non-emitting portion 310c are separated from each other due to the second bank 244.

When the photolithography process progresses, the side surface of the second light non-emitting portion 310c of the first light emitting layer 310 may be exposed and the exposed side surface of the second light non-emitting portion 310c may be damaged. In the display device according to the embodiment of the present disclosure, since the light emitting portion 310a and the first light non-emitting portion 310b are separated from each other or the first light non-emitting portion 310b and the second light non-emitting portion 310c are separated from each other, the second light non-emitting portion 310c may be damaged but the damage does not diffuse into the light emitting portion 310a.

As a result, with the display device according to the embodiment of the present disclosure, it is possible to reduce or minimize damage of the first light emitting portion 310 in the photolithography process.

As illustrated in FIG. 4, the second light emitting layer 320 includes a light emitting portion 320a that is provided between the first electrode 220 and the second electrode 400 and includes an emission area emitting light and a first light non-emitting portion 320b that is provided on the second bank 244 and does not emit light. Here, in the second light emitting layer 320, the light emitting portion 320a and the first light non-emitting portion 320b are separated from each other due to the second bank 244.

In a photolithography process of forming the second light emitting layer 320, a shield layer is applied onto the second light emitting layer 320 and then a photoresist is applied thereon in order to prevent damage of the second light emitting layer 320. When the shield layer is applied onto the second light emitting layer 320 in this way, the top surface of the second light emitting layer 320 is covered by the shield layer but the side surface of the second light emitting layer 320, particularly, the side surface of the first light non-emitting portion 320b, is exposed. When the photolithography process progresses, the side surface of the first light non-emitting portion 320b can be damaged. In the display device according to the embodiment of the present disclosure, since the light emitting portion 320a and the first light non-emitting portion 320b of the second light emitting layer 320 are separated from each other, the first light non-emitting portion 320b may be damaged but the damage does not diffuse into the light emitting portion 320a.

On the other hand, as illustrated in FIG. 5, the second light emitting layer 320 may include a light emitting portion 320a that is provided between the first electrode 220 and the second electrode 400 and includes an emission area emitting light, a first light non-emitting portion 320b that is provided on the second bank 244 and does not emit light, and a second light non-emitting portion 320c that is provided on the first bank 242 on which the second bank 244 is not formed and does not emit light. In the second light emitting layer 320, the light emitting portion 320a and the first light non-emitting portion 320b are separated from each other or the first light non-emitting portion 320b and the second light non-emitting portion 320c are separated from each other due to the second bank 244.

When the photolithography process progresses, the side surface of the second light non-emitting portion 320c of the second light emitting layer 320 may be exposed and the exposed side surface of the second light non-emitting portion 320c may be damaged. In the display device according to the embodiment of the present disclosure, since the light emitting portion 320a and the first light non-emitting portion 320b are separated from each other or the first light non-emitting portion 320b and the second light non-emitting portion 320c are separated from each other, the second light non-emitting portion 320c may be damaged but the damage does not diffuse into the light emitting portion 320a. The second light non-emitting portion 310c, 320c are illustrated in FIG. 5 as being located in each side of the light emitting portion 310a, 320a, respectively. However, in other embodiments, the second light non-emitting portion 310c, 320c can both be located in each side of the light emitting portions 310a, 320a.

As a result, with the display device according to the embodiment of the present disclosure, it is possible to reduce or minimize damage of the second light emitting layer 320 in the photolithography process.

The third light emitting layer 330 includes a light emitting portion 330a that is provided between the first electrode 230 and the second electrode 400 and includes an emission area emitting light and a first light non-emitting portion 330b that is provided on the second bank 244 and does not emit light. Here, in the third light emitting layer 330, the light emitting portion 330a and the first light non-emitting portion 330b are separated from each other due to the second bank 244.

In a photolithography process of forming the third light emitting layer 330, a shield layer is applied onto the third light emitting layer 330 and then a photoresist is applied thereon in order to prevent damage of the third light emitting layer 330. When the shield layer is applied onto the third light emitting layer 330 in this way, the top surface of the third light emitting layer 330 is covered by the shield layer but the side surface of the third light emitting layer 330, particularly, the side surface of the first light non-emitting portion 330b, is exposed. When the photolithography process progresses, the side surface of the first light non-emitting portion 330b can be damaged. In the display device according to the embodiment of the present disclosure, since the light emitting portion 330a and the first light non-emitting portion 330b of the third light emitting layer 330 are separated from each other, the first light non-emitting portion 330b may be damaged but the damage does not diffuse into the light emitting portion 330a. As a result, with the display device according to the embodiment of the present disclosure, it is possible to reduce or minimize damage of the third light emitting layer 330 in the photolithography process.

On the other hand, the third light emitting layer 330 may include a light emitting portion 330a that is provided between the first electrode 230 and the second electrode 400 and includes an emission area emitting light, a first light non-emitting portion 330b that is provided on the second bank 244 and does not emit light, and a second light non-emitting portion 330c that is provided on the first bank 242 on which the second bank 244 is not formed and does not emit light. In the third light emitting layer 330, the light emitting portion 330a and the first light non-emitting portion 330b are separated from each other or the first light non-emitting portion 330b and the second light non-emitting portion 330c are separated from each other due to the second bank 244.

When the photolithography process progresses, the side surface of the second light non-emitting portion 330c of the third light emitting layer 330 may be exposed and the exposed side surface of the second light non-emitting portion 330c may be damaged. In the display device according to the embodiment of the present disclosure, since the light emitting portion 330a and the first light non-emitting portion 330b are separated from each other or the first light non-emitting portion 330b and the second light non-emitting portion 330c are separated from each other, the second light non-emitting portion 330c may be damaged but the damage does not diffuse into the light emitting portion 330a.

As a result, with the display device according to the embodiment of the present disclosure, it is possible to reduce or minimize damage of the third light emitting layer 330 in the photolithography process.

In the display device according to the embodiment of the present disclosure, a width W2 of the second bank 244 may be set to be less than a width W1 of the first bank 242. Since the second bank 244 is formed in patterns with a smaller width W2, the shield layer covers the second bank 244 in the photolithography process. The shield layer is fixed to the position at which the shield layer has been first formed due to the second bank 244 and is not pushed or moved even when the first substrate 100 moves.

The second bank 244 is formed of a metal material or an inorganic material. When the second bank 244 is formed of a metal material, it is possible to reduce or minimize damage of the second bank 244 in the photolithography process including a developing process and an etching process. However, it is difficult to form the second bank 244 with a sufficient height out of a metal material.

On the other hand, when the second bank 244 is formed of an inorganic film such as a silicon oxide film (SiOx), a silicon nitride film (SiNx), or a multilayered film thereof, the second bank 244 can have a relatively greater height in comparison with a metal material. However, the second bank 244 formed of an inorganic material may be relatively greatly damaged in the etching process in comparison with a metal material.

On the basis of the above description, the second bank 244 may include an inorganic bank 244a and a metal bank 244b as illustrated in FIG. 6. The inorganic bank 244a is provided on the first bank 242 and is formed of an inorganic material. The metal bank 244b is provided on the inorganic bank 244a and is formed of a metal material. The metal bank 244b can also be provided on the side surface of the inorganic bank 244a in addition to the top surface thereof. The second bank 244 can have a sufficient height due to the inorganic bank 244a and damage thereof can be reduced or minimized by the metal bank 244b.

The encapsulation film 500 is provided to cover the second electrode 400. The encapsulation film 500 serves to prevent oxygen or moisture from permeating into the light emitting layer 300 and the second electrode 400. For this purpose and other purposes as well, the encapsulation film 500 may include at least one inorganic film and at least one organic film.

Specifically, the encapsulation film 500 includes a first inorganic film and an organic film. For example, the encapsulation film 500 may further include a second inorganic film.

The first inorganic film is provided to cover the second electrode 400. In one or more embodiments, the organic film is provided on the first inorganic film to have a length enough to prevent particles from permeating into the light emitting layer 300 and the second electrode 400 via the first inorganic film. The second inorganic film is provided to cover the organic film.

Each of the first and second inorganic films is formed of silicon nitride, aluminum nitride, zirconium nitride, titanium nitride, hafnium nitride, tantalum nitride, silicon oxide, aluminum oxide, or titanium oxide. The first and second inorganic films are formed using a chemical vapor deposition (CVD) method or an atomic layer deposition (ALD) method, but the present disclosure is not limited thereto.

The organic film is formed of an acryl resin, an epoxy resin, a phenolic resin, a polyamide resin, or a polyimide resin. The organic film may be formed using a vapor deposition method, a printing method, a slit coating method using an organic material, but the present disclosure is not limited thereto, and the organic film may be formed using other methods such as an ink-jet method.

The second substrate 600 may be a plastic film or a glass substrate. The second substrate 600 may be formed of a transparent material or may be formed of an opaque material.

The display device according to the embodiment of the present disclosure may employ a so-called bottom emission system in which emitted light is discharged to the bottom side. In this case, the second substrate 600 is formed of an opaque material. On the other hand, the display device according to the embodiment of the present disclosure may employ a so-called top emission system in which emitted light is discharged to the top side. In this case, the second substrate 600 is formed of a transparent material.

The second substrate 600 is bonded to the first substrate 100 on which the encapsulation film 500 is formed using an adhesive layer.

Second Embodiment

Figure 7:
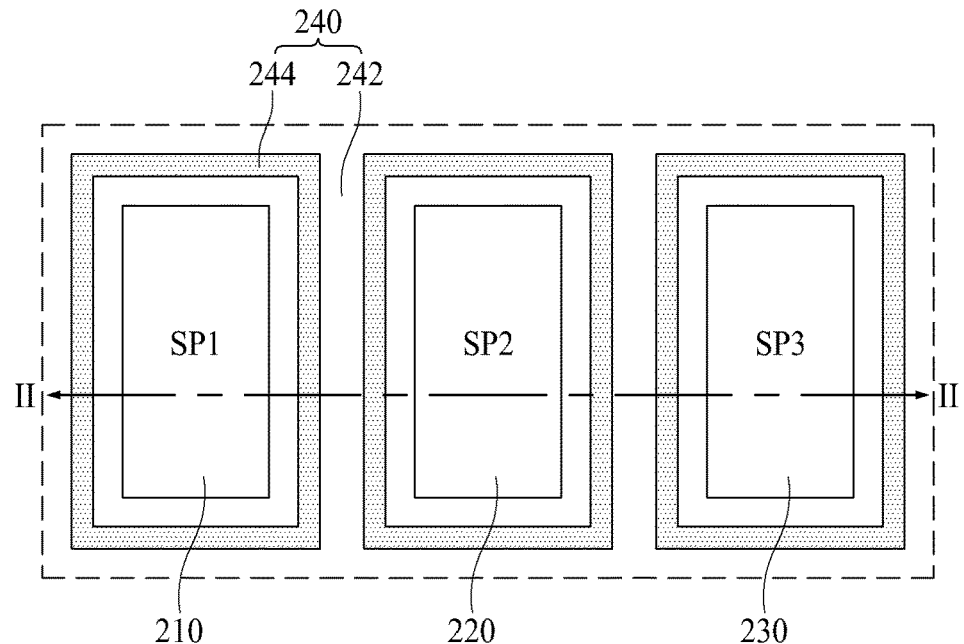
FIG. 7 is a plan view schematically illustrating subpixels according to a second embodiment of the present disclosure.
Figure 8:
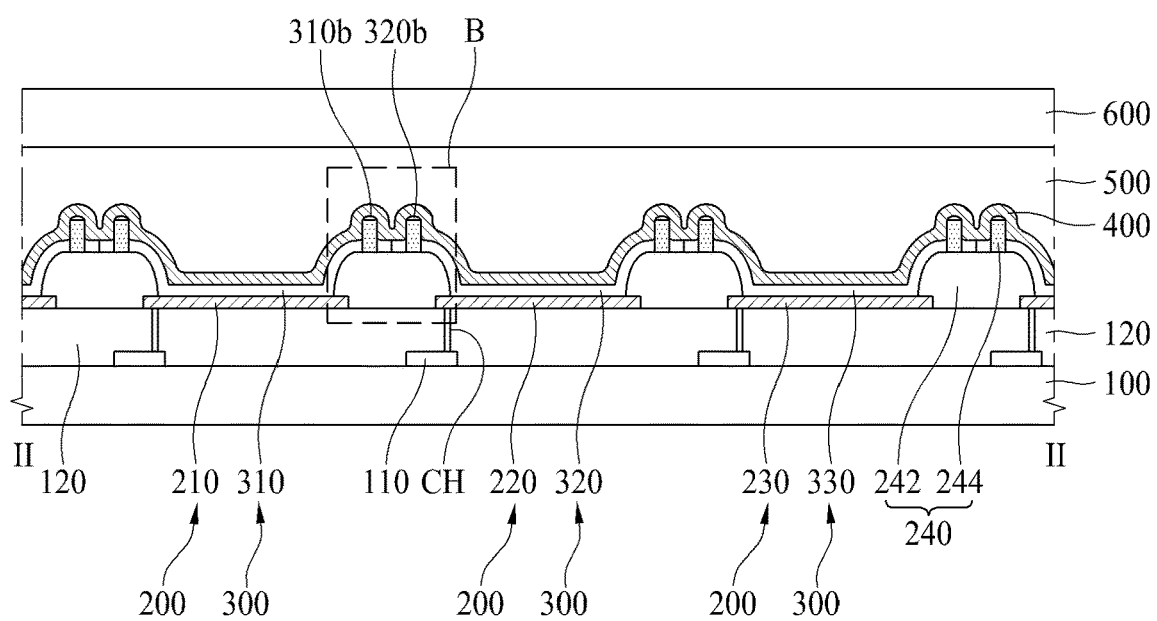
FIG. 8 is a sectional view taken along line II-II in FIG. 7.
Figure 9:
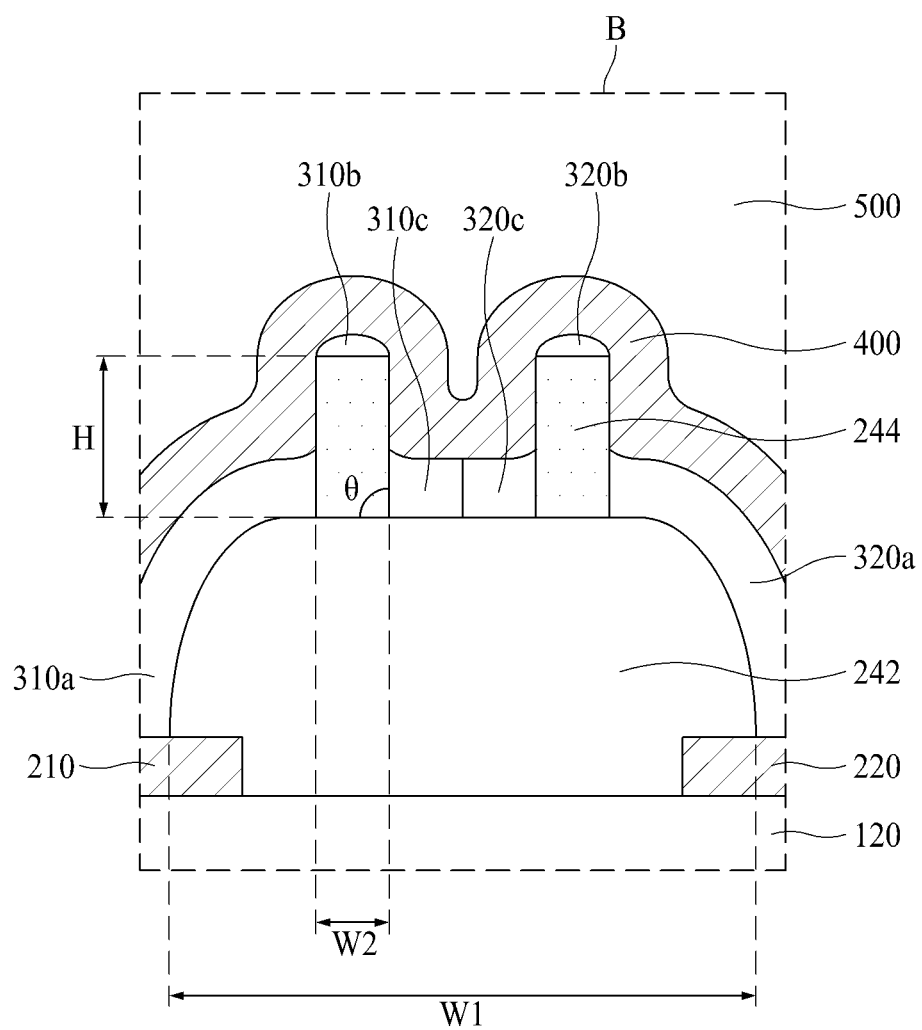
FIG. 9 is an enlarged view illustrating an example of area B.

FIG. 7 is a plan view schematically illustrating subpixels according to a second embodiment of the present disclosure. FIG. 8 is a sectional view taken along line II-II in FIG. 7. FIG. 9 is an enlarged view illustrating an example of area B in FIG. 8.

Referring to FIGS. 7, 8, and 9, a display device according to a second embodiment of the present disclosure includes a first substrate 100, a driving thin-film transistor 110, an insulating film 120, a first electrode 200, a bank 240, a light emitting layer 300, a second electrode 400, an encapsulation film 500, and a second substrate 600.

The first substrate 100, the driving thin-film transistor 110, the insulating film 120, the first electrode 200, the second electrode 400, the encapsulation film 500, and the second substrate 600 which are illustrated in FIGS. 7, 8, and 9 are substantially the same as the first substrate 100, the driving thin-film transistor 110, the insulating film 120, the first electrode 200, the second electrode 400, the encapsulation film 500, and the second substrate 600 which are illustrated in FIGS. 1 to 5 and thus detailed description thereof will not be repeated.

The display device illustrated in FIGS. 7, 8, and 9 are different from the display device illustrated in FIGS. 1 to 5, in that the second bank 244 includes a plurality of bank patterns. In the following description, repeated description will be omitted and the difference will be mainly described.

In the second embodiment of the present disclosure, the bank 240 is provided on the insulating film 120. The bank 240 is formed in a matrix structure in boundaries between a plurality of subpixels SP1, SP2, and SP3 to form emission areas of the plurality of subpixels SP1, SP2, and SP3. That is, an exposed area of the first electrode 210, 220, or 230 which is not covered by the bank 240 but is exposed in each of the subpixels SP1, SP2, and SP3 serves as an emission area.

The bank 240 includes a first bank 242 and a second bank 244.

The first bank 242 is provided between the first electrodes 210, 220, and 230. Here, the first bank 242 is provided to cover ends of the first electrodes 210, 220, and 230. Accordingly, it is possible to prevent a problem in that a current is concentrated on the ends of the first electrodes 210, 220, and 230 to decrease emission efficiency.

The first bank 242 is formed of an inorganic film such as a silicon oxide film (SiOx), a silicon nitride film (SiNx), or a multilayered film thereof, but the present disclosure is not limited thereto. The first bank 242 may be formed of an organic material such as an acryl resin, an epoxy resin, a phenolic resin, a polyamide resin, or a polyimide resin.

In one or more embodiments, the first bank 242 is formed of an inorganic film to prevent damage in the course of the manufacturing process. Specifically, in the display device, the light emitting layer 300 is formed after the bank 240 has been formed. At this time, the light emitting layer 300 is formed for each subpixel using photolithography. The photolithography includes a process of forming a shield layer, a process of applying a photoresist, an exposure process, a developing process, an etching process, and a removal process. When the photolithography process progresses, a part of the first bank 242 may be exposed and the exposed first bank 242 may be damaged. In the display device according to the embodiment of the present disclosure, damage of the first bank 242 can be reduced or minimized by forming the first bank 242 out of an inorganic material.

The second bank 244 is provided on the first bank 242. In the display device according to the second embodiment of the present disclosure, the second bank 244 includes a plurality of bank patterns which are provided between two neighboring subpixels SP1, SP2, and SP3. In the display device according to the second embodiment of the present disclosure, it is possible to more effectively reduce or minimize damage of the light emitting layer 300 by forming the second bank 244 in a plurality of bank patterns. It is also possible to more effectively prevent the shield layer from being pushed or moved in the photolithography process.

The width W1 of the first bank 242 increases to form a plurality of bank patterns on the first bank 242. Accordingly, aperture ratios of the subpixels SP1, SP2, and SP3 can decrease.

On the other hand, in the above-mentioned display device according to the embodiment of the present disclosure, the second bank 244 is formed as one bank pattern between two neighboring subpixels SP1, SP2, and SP3. Since only one bank pattern is formed on the first bank 242, the width W1 of the first bank 242 can be decreased to the width W2 of the second bank 244. Accordingly, aperture ratios of the subpixels SP1, SP2, and SP3 can increase.

Accordingly, the display device according to the second embodiment of the present disclosure can be applied to products with a large area such as a TV. On the other hand, the display device according to the embodiment of the present disclosure can be applied to products requiring ultrahigh definition such as a head-mounted display (HMD) device.

The second bank 244 has a sufficient height such that the light emitting layers 310, 320, and 330 which are provided on the second bank 244 and the light emitting layers 310, 320, and 330 which are provided on the first bank 242 on which the second bank 244 is not provided can be separated from each other at the time of deposition of the light emitting layers 310, 320, and 330. For example, the height H of the second bank 244 may be equal to or greater than 3000 Å.

In the second bank 244, an angle formed by the bottom surface of the second bank 244 in contact with the first bank 242 and the side surface thereof may be equal to or greater than 90 degrees. That is, the second bank 244 has a right-angled structure or an inverse taper structure.

As illustrated in FIG. 7, the second bank 244 is provided to surround (or laterally surround) each of the first subpixel SP1, the second subpixel SP2, and the third subpixel SP3.

In the display device according to the second embodiment of the present disclosure, the light emitting layers 310, 320, and 330 which are provided on the second bank 244 and the light emitting layers 310, 320, and 330 which are provided on the first bank 242 on which the second bank 244 is not provided can be separated from each other due to the second bank 244 which has been formed as described above.

As illustrated in FIG. 9, the first light emitting layer 310 includes a light emitting portion 310a that is provided between the first electrode 210 and the second electrode 400 and includes an emission area emitting light, a first light non-emitting portion 310b that is provided on at least one bank pattern and does not emit light, and a second light non-emitting portion 320c that is provided on the first bank 242 on which the second bank 244 is not formed and does not emit light. Here, at least one bank pattern refers to at least one bank pattern which is disposed adjacent to the first subpixel SP1 out of a plurality of bank patterns.

In FIGS. 8 and 9, two bank patterns are provided between the first subpixel SP1 and the second subpixel SP2 which are adjacent to each other, but the present disclosure is not limited thereto. Three or more bank patterns may be provided between the first subpixel SP1 and the second subpixel SP2 which are adjacent to each other. In this case, the first light emitting layer 310 is formed on at least one bank pattern which is disposed adjacent to the first subpixel SP1 out of a plurality of bank patterns.

In the first light emitting layer 310, the light emitting portion 310a and the first light non-emitting portion 310b are separated from each other or the first light non-emitting portion 310b and the second light non-emitting portion 310c are separated from each other due to the second bank 244.

When the photolithography process progresses, the side surface of the second light non-emitting portion 310c of the first light emitting layer 310 may be exposed and the exposed side surface of the second light non-emitting portion 310c may be damaged. In the display device according to the second embodiment of the present disclosure, since the light emitting portion 310a and the first light non-emitting portion 310b are separated from each other or the first light non-emitting portion 310b and the second light non-emitting portion 310c are separated from each other, the second light non-emitting portion 310c may be damaged but the damage does not diffuse into the light emitting portion 310a.

As a result, with the display device according to the embodiment of the present disclosure, it is possible to reduce or minimize damage of the first light emitting portion 310 in the photolithography process.

As illustrated in FIG. 9, the second light emitting layer 320 includes a light emitting portion 320a that is provided between the first electrode 220 and the second electrode 400 and includes an emission area emitting light, a first light non-emitting portion 320b that is provided on at least one bank pattern and does not emit light, and a second light non-emitting portion 320c that is provided on the first bank 242 on which the second bank 244 is not formed and does not emit light. Here, at least one bank pattern refers to at least one bank pattern which is disposed adjacent to the second subpixel SP2 out of a plurality of bank patterns.

In FIGS. 8 and 9, two bank patterns are provided between the first subpixel SP1 and the second subpixel SP2 which are adjacent to each other and between the second subpixel SP2 and the third subpixel SP3 which are adjacent to each other, but the present disclosure is not limited thereto. Three or more bank patterns may be provided between the first subpixel SP1 and the second subpixel SP2 which are adjacent to each other and between the second subpixel SP2 and the third subpixel SP3 which are adjacent to each other. In this case, the second light emitting layer 320 is provided on at least one bank pattern which is disposed adjacent to the second subpixel SP2 out of a plurality of bank patterns.

In the second light emitting layer 320, the light emitting portion 320a and the first light non-emitting portion 320b are separated from each other or the first light non-emitting portion 320b and the second light non-emitting portion 320c are separated from each other due to the second bank 244.

When the photolithography process progresses, the side surface of the second light non-emitting portion 320c of the second light emitting layer 320 may be exposed and the exposed side surface of the second light non-emitting portion 320c may be damaged. In the display device according to the second embodiment of the present disclosure, since the light emitting portion 320a and the first light non-emitting portion 320b of the second light emitting layer 320 are separated from each other or the first light non-emitting portion 320b and the second light non-emitting portion 320c are separated from each other, the second light non-emitting portion 320c may be damaged but the damage does not diffuse into the light emitting portion 320a.

As a result, with the display device according to the embodiment of the present disclosure, it is possible to reduce or minimize damage of the second light emitting portion 320 in the photolithography process.

The third light emitting layer 330 includes a light emitting portion 330a that is provided between the first electrode 230 and the second electrode 400 and includes an emission area emitting light, a first light non-emitting portion 330b that is provided on at least one bank pattern and does not emit light, and a second light non-emitting portion 330c that is provided on the first bank 242 on which the second bank 244 is not formed and does not emit light. Here, the at least one bank pattern refers to at least one bank pattern which is disposed adjacent to the third subpixel SP3 out of a plurality of bank patterns.

In the third light emitting layer 330, the light emitting portion 330a and the first light non-emitting portion 330b are separated from each other or the first light non-emitting portion 330b and the second light non-emitting portion 330c are separated from each other due to the second bank 244.

When the photolithography process progresses, the side surface of the second light non-emitting portion 330c of the third light emitting layer 330 may be exposed and the exposed side surface of the second light non-emitting portion 330c may be damaged. In the display device according to the second embodiment of the present disclosure, since the light emitting portion 330a and the first light non-emitting portion 330b of the third light emitting layer 330 are separated from each other or the first light non-emitting portion 330b and the second light non-emitting portion 330c are separated from each other, the second light non-emitting portion 330c may be damaged but the damage does not diffuse into the light emitting portion 330a.

As a result, with the display device according to the embodiment of the present disclosure, it is possible to reduce or minimize damage of the third light emitting portion 330 in the photolithography process.

In the display device according to the second embodiment of the present disclosure, the second bank 244 is formed in a plurality of patterns with a width less than the width of the first bank 242. Since the second bank 244 is formed in a plurality of patterns with the less width W2, the shield layer covers at least one bank pattern in the photolithography process. The shield layer is fixed to the position at which the shield layer has been first formed due to the at least one bank pattern and is not pushed or moved even when the first substrate 100 moves.

The second bank 244 is formed of a metal material or an inorganic material. When the second bank 244 is formed of a metal material, it is possible to reduce or minimize damage of the second bank 244 in the photolithography process including a developing process and an etching process. However, it is difficult to form the second bank 244 with a sufficient height out of a metal material.

On the other hand, when the second bank 244 is formed of an inorganic film such as a silicon oxide film (SiOx), a silicon nitride film (SiNx), or a multilayered film thereof, the second bank 244 can have a relatively great height in comparison with a metal material. However, the second bank 244 formed of an inorganic material may be relatively greatly damaged in the etching process in comparison with a metal material.

On the basis of the above description, the second bank 244 may include an inorganic bank 244a and a metal bank 244b as illustrated in FIG. 6. The inorganic bank 244a is provided on the first bank 242 and is formed of an inorganic material. The metal bank 244b is provided on the inorganic bank 244a and is formed of a metal material. The metal bank 244b can also be provided on the side surface of the inorganic bank 244a in addition to the top surface thereof. The second bank 244 can have a sufficient height due to the inorganic bank 244a and damage thereof can be reduced or minimized by the metal bank 244b.

In FIGS. 2 and 7, the first to third subpixels SP1, SP2, and SP3 have the same shape, but the present disclosure is not limited thereto. In another embodiment of the present disclosure, the first to third subpixels SP1, SP2, and SP3 may have different shapes. Description will be made below with reference to FIGS. 10 and 11.

Figure 10:
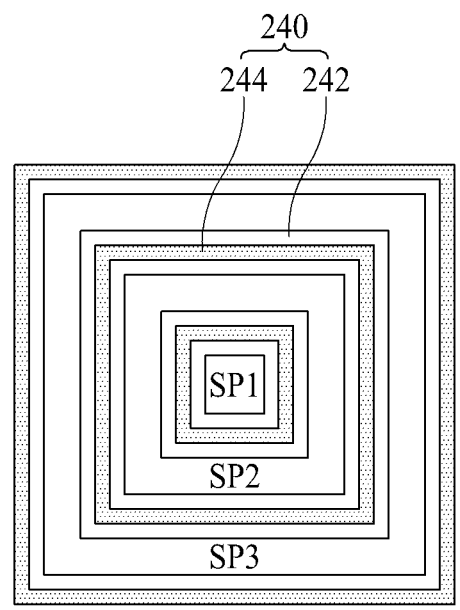
FIG. 10 is a plan view schematically illustrating subpixels according to a third embodiment of the present disclosure.

FIG. 10 is a plan view illustrating subpixels according to a third embodiment of the present disclosure.

Referring to FIG. 10, a display device according to a third embodiment of the present disclosure includes a first subpixel SP1 in which a first light emitting layer that emits light of a first color is provided, a second subpixel SP2 in which a second light emitting layer that emits light of a second color is provided, and a third subpixel SP3 in which a third light emitting layer that emits light of a third color is provided.

The first to third subpixels SP1, SP2, and SP3 have different shapes. Specifically, the first subpixel SP1 has a rectangular shape. The second subpixel SP2 has a shape with a predetermined width which surrounds (or laterally surrounds) the first subpixel SP1. The third subpixel SP3 has a shape with a predetermined width which surrounds (or laterally surrounds) the second subpixel SP2.

In FIG. 10, the first subpixel SP1 has a rectangular shape, but the present disclosure is not limited thereto. The first subpixel SP1 may have various shapes such as a circular shape and a polygonal shape depending on design thereof.

A first bank 244 and a second bank 242 with a width less than that of the first bank 244 are provided between the first subpixel SP1 and the second subpixel SP2. Here, the first bank 244 and the second bank 242 are provided to surround (or laterally surround) the first subpixel SP1.

A first bank 244 and a second bank 242 with a width less than that of the first bank 244 are provided between the second subpixel SP2 and the third subpixel SP3. Here, the first bank 244 and the second bank 242 are provided to surround (or laterally surround) the second subpixel SP2.

A first bank 244 and a second bank 242 with a width less than that of the first bank 244 are provided to surround (or laterally surround) the third subpixel SP3.

With the display device including the first to third subpixels SP1, SP2, and SP3 illustrated in FIG. 10, it is possible to reduce damage of the light emitting layer 300 in comparison with the display device including the first to third subpixels SP1, SP2, and SP3 illustrated in FIG. 2 or 7.

More specifically, it is assumed that the first light emitting layer 310 is formed in patterns in the first subpixel SP1 through a first photolithography process, then the second light emitting layer 320 is formed in patterns in the second subpixel SP2 through a second photolithography process, and then the third light emitting layer 330 is formed in patterns in the third subpixel SP3 through a third photolithography process.

In the display device including the first to third subpixels SP1, SP2, and SP3 illustrated in FIG. 2 or 7, the side surface of the first light emitting layer 310 is damaged in the first photolithography process. In the display device including the first to third subpixels SP1, SP2, and SP3 illustrated in FIG. 2 or 7, the side surface of the second light emitting layer 320 and the side surface of the first light emitting layer 310 are damaged in the second photolithography process. In the display device including the first to third subpixels SP1, SP2, and SP3 illustrated in FIG. 2 or 7, the side surface of the third light emitting layer 330, the side surface of the second light emitting layer 320, and the side surface of the first light emitting layer 310 are damaged in the third photolithography process.

As a result, the first light emitting layer 310 is damaged three times in three photolithography processes. The second light emitting layer 320 is damaged two times in three photolithography processes. The third light emitting layer 330 is damaged one time in three photolithography processes.

On the other hand, in the display device including the first to third subpixels SP1, SP2, and SP3 illustrated in FIG. 10, the side surface of the first light emitting layer 310 is damaged in the first photolithography process. In the display device including the first to third subpixels SP1, SP2, and SP3 illustrated in FIG. 10, only the side surface of the second light emitting layer 320 is damaged in the second photolithography process. This is because the first light emitting layer 310 is surrounded by the second light emitting layer 320. In the display device including the first to third subpixels SP1, SP2, and SP3 illustrated in FIG. 10, only the side surface of the third light emitting layer 330 is damaged in the third photolithography process. This is because the second light emitting layer 320 is surrounded by the third light emitting layer 330.

As a result, the first light emitting layer 310 is damaged one time in three photolithography processes. The second light emitting layer 320 is damaged one time in three photolithography processes. The third light emitting layer 330 is damaged one time in three photolithography processes.

Figure 11:
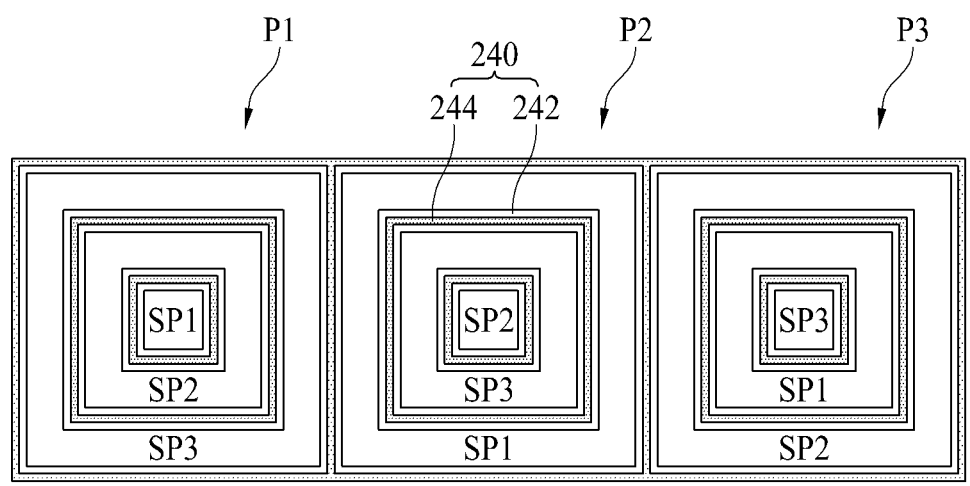
FIG. 11 is a plan view schematically illustrating subpixels according to a fourth embodiment of the present disclosure.

FIG. 11 is a plan view illustrating subpixels according to a fourth embodiment of the present disclosure.

Referring to FIG. 11, each of a plurality of pixels P1, P2, and P3 includes a first subpixel SP1 in which a first light emitting layer that emits light of a first color is provided, a second subpixel SP2 in which a second light emitting layer that emits light of a second color is provided, and a third subpixel SP3 in which a third light emitting layer that emits light of a third color is provided.

The first to third subpixels SP1, SP2, and SP3 included in each of the plurality of pixels P1, P2, and P3 have different shapes.

Specifically, the first pixel P1 includes first to third subpixels SP1, SP2, and SP3. The first subpixel SP1 of the first pixel P1 has a rectangular shape. The second subpixel SP2 of the first pixel P1 has a shape with a predetermined width which surrounds (or laterally surrounds) the first subpixel SP1. The third subpixel SP3 of the first pixel P1 has a shape with a predetermined width which surrounds (or laterally surrounds) the second subpixel SP2.

In FIG. 11, the first subpixel SP1 of the first pixel P1 has a rectangular shape, but the present disclosure is not limited thereto. The first subpixel SP1 of the first pixel P1 may have various shapes such as a circular shape and a polygonal shape depending on design thereof.

A first bank 244 and a second bank 242 are provided between the first subpixel SP1 of the first pixel P1 and the second subpixel SP2 of the first pixel P1. Here, the first bank 244 and the second bank 242 are provided to surround (or laterally surround) the first subpixel SP1 of the first pixel P1.

A first bank 244 and a second bank 242 are provided between the second subpixel SP2 of the first pixel P1 and the third subpixel SP3 of the first pixel P1. Here, the first bank 244 and the second bank 242 are provided to surround (or laterally surround) the second subpixel SP2 of the first pixel P1.

A first bank 244 and a second bank 242 are provided between the third subpixel SP3 of the first pixel P1 and the first subpixel SP1 of the second pixel P2. Here, the first bank 244 and the second bank 242 are provided to surround (or laterally surround) the third subpixel SP3 of the first pixel P1.

The second pixel P2 is disposed adjacent to the first pixel P1 in a first direction and includes first to third subpixels SP1, SP2, and SP3. The second subpixel SP2 of the second pixel P2 has a rectangular shape. The third subpixel SP3 of the second pixel P2 has a shape with a predetermined width which surrounds (or laterally surrounds) the second subpixel SP2. The first subpixel SP1 of the second pixel P2 has a shape with a predetermined width which surrounds (or laterally surrounds) the third subpixel SP3.

In FIG. 11, the second subpixel SP2 of the second pixel P2 has a rectangular shape, but the present disclosure is not limited thereto. The second subpixel SP2 of the second pixel P2 may have various shapes such as a circular shape and a polygonal shape depending on design thereof.

A first bank 244 and a second bank 242 are provided between the second subpixel SP2 of the second pixel P2 and the third subpixel SP3 of the second pixel P2. Here, the first bank 244 and the second bank 242 are provided to surround the second subpixel SP2 of the second pixel P2.

A first bank 244 and a second bank 242 are provided between the third subpixel SP3 of the second pixel P2 and the first subpixel SP1 of the second pixel P2. Here, the first bank 244 and the second bank 242 are provided to surround the third subpixel SP3 of the second pixel P2.

A first bank 244 and a second bank 242 are provided between the first subpixel SP1 of the second pixel P2 and the second subpixel SP2 of the third pixel P3. Here, the first bank 244 and the second bank 242 are provided to surround the first subpixel SP1 of the second pixel P2.

The third pixel P3 is disposed adjacent to the second pixel P1 in the first direction and includes first to third subpixels SP1, SP2, and SP3. The third subpixel SP3 of the third pixel P3 has a rectangular shape. The first subpixel SP1 of the third pixel P3 has a shape with a predetermined width which surrounds the third subpixel SP3. The second subpixel SP2 of the third pixel P3 has a shape with a predetermined width which surrounds the first subpixel SP1.

In FIG. 11, the third subpixel SP3 of the third pixel P3 has a rectangular shape, but the present disclosure is not limited thereto. The third subpixel SP3 of the third pixel P3 may have various shapes such as a circular shape and a polygonal shape depending on design thereof.

A first bank 244 and a second bank 242 are provided between the third subpixel SP3 of the third pixel P3 and the first subpixel SP1 of the third pixel P3. Here, the first bank 244 and the second bank 242 are provided to surround the third subpixel SP3 of the third pixel P3.

A first bank 244 and a second bank 242 are provided between the first subpixel SP1 of the third pixel P3 and the second subpixel SP2 of the third pixel P3. Here, the first bank 244 and the second bank 242 are provided to surround the first subpixel SP1 of the third pixel P3.

The first bank 244 and the second bank 242 are provided to surround the second subpixel SP2 of the third pixel P3.

In the pixels P1, P2, and P3 illustrated in FIG. 11, the total areas of the first to third subpixels SP1, SP2, and SP3 are the same. Specifically, the total area of the first subpixels SP1 included in the first to third pixels P1, P2, and P3, the total area of the second subpixels SP2 included in the first to third pixels P1, P2, and P3, and the total area of the third subpixels SP3 included in the first to third pixels P1, P2, and P3 are the same.

Accordingly, in the display device including the first to third subpixels SP1, SP2, and SP3 illustrated in FIG. 11, since the area from which light of a first color is emitted, the area from which light of a second color is emitted, and the area from which light of a third color is emitted are the same, it is possible to provide uniform image quality.

In the display device including the first to third subpixels SP1, SP2 and SP3 illustrated in FIG. 11, it is possible to decrease damage of the light emitting layer 300 in comparison with the display device including the first to third subpixels SP1, SP2, and SP3 illustrated in FIG. 2 or 7.

FIG. 12 is a flowchart illustrating a method of manufacturing a display device according to an embodiment of the present disclosure. FIGS. 13A to 13H are sectional views illustrating a method of manufacturing a display device according to the embodiment of the present disclosure.

First, a first electrode 200 is formed on the substrate 100 (S1201).

Figure 13A:
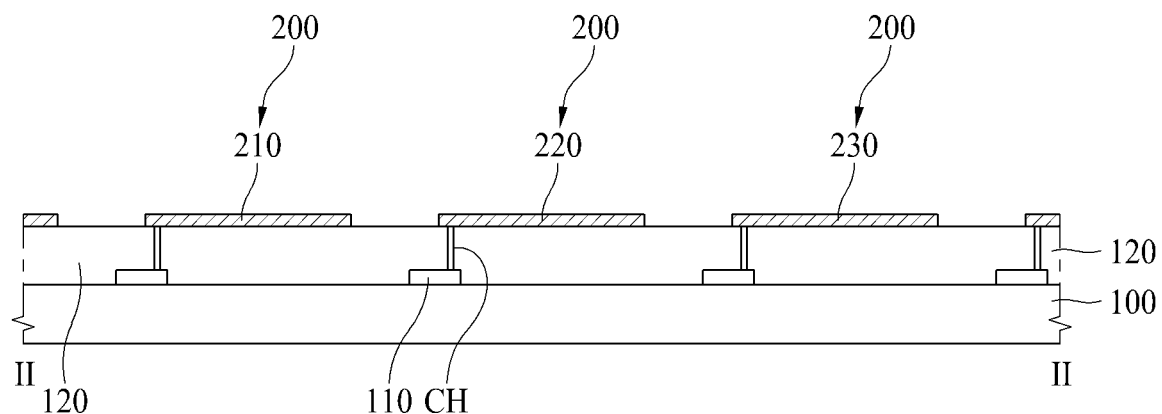
FIGS. 13A to 13H are sectional views illustrating a method of manufacturing a display device according to the embodiment of the present disclosure.

More specifically, a driving thin-film transistor 110 is formed on the substrate 100 as illustrated in FIG. 13A.

Then, an insulating film 120 is formed on the driving thin-film transistor 110. The insulating film 120 may be formed of, for example, an inorganic film such as a silicon oxide film (SiOx), a silicon nitride film (SiNx), or a multi-layered film thereof.

Then, a contact hole CH that is connected to the driving thin-film transistor 110 via the insulating film 120 is formed.

Then, first electrodes 210, 220, and 230 are formed on the insulating film 120. More specifically, a lower electrode film is formed on the insulating film 120. The lower electrode film is formed of a metal material with high reflectance such as a stacked structure (Ti/Al/Ti) of aluminum and titanium, a stacked structure (ITO/Al/ITO) of aluminum and ITO, an APC alloy, and a stacked structure (ITO/APC/TIO) of an APC alloy and ITO. An APC alloy is an alloy of silver (Ag), palladium (Pd), and copper (Cu).

Then, a photoresist pattern is formed on the lower metal film. The photoresist pattern is formed at positions at which the first to third subpixels SP1, SP2, and SP3 are to be formed. The lower metal film which is not covered by the photoresist pattern is dry-etched to form the first electrodes 210, 220, and 230 as illustrated in FIG. 13A and then the photoresist pattern is removed.

Then, a bank 240 is formed (S1202).

Figure 13B:
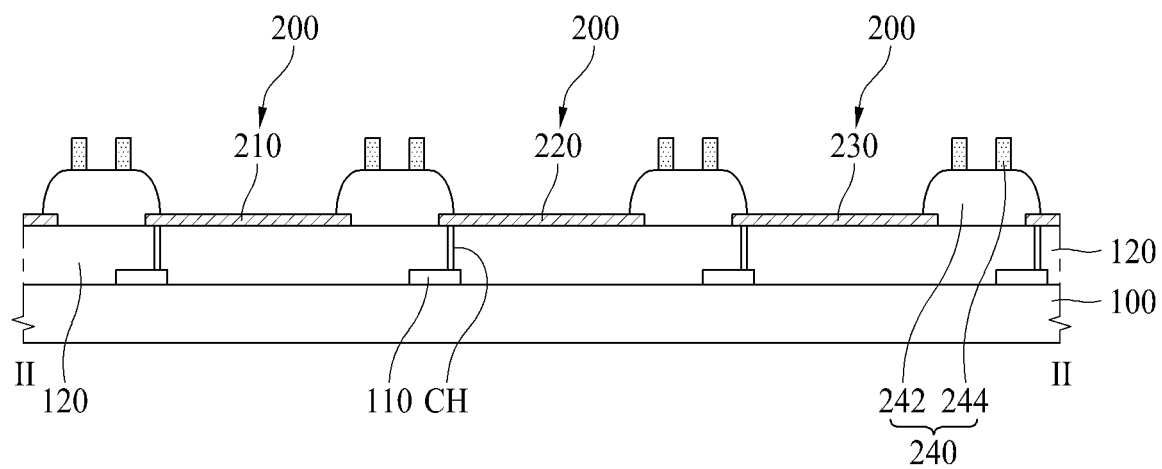

As illustrated in FIG. 13B, the bank 240 is formed to cover edges of the first electrodes 210, 220, and 230. More specifically, a first bank 242 and a second bank 244 are formed. The first bank 242 is formed of an inorganic material, and the second bank 244 is formed of a metal material or an inorganic material. The first bank 242 and the second bank 244 can be formed using various formation methods.

For example, an inorganic film is deposited on the first electrodes 210, 220, and 230. Then, a metal film is deposited on the inorganic film. A photoresist pattern is formed on the metal film. The photoresist pattern is formed at positions at which the second bank 244 is to be formed. The metal film which is not covered by the photoresist pattern is dry-etched to form the second bank 244 including a plurality of bank patterns as illustrated in FIG. 13B, and then the photoresist pattern is removed. Then, an etching process is performed to form the first bank 242. Here, the first bank 242 is formed of an inorganic material and the second bank 244 is formed of a metal material.

For example, the first bank 242 may be formed in patterns to cover the edges of the first electrodes 210, 220, and 230 using a chemical vapor deposition (CVD) method or an atomic layer deposition (ALD) method. Then, the second bank 244 may be formed in patterns on the first bank 242 using a chemical vapor deposition (CVD) method or an atomic layer deposition (ALD) method. Here, the first bank 242 and the second bank 244 are formed of an inorganic material.

Then, a first light emitting layer 310 is formed in patterns (S1203).

Figure 13C:
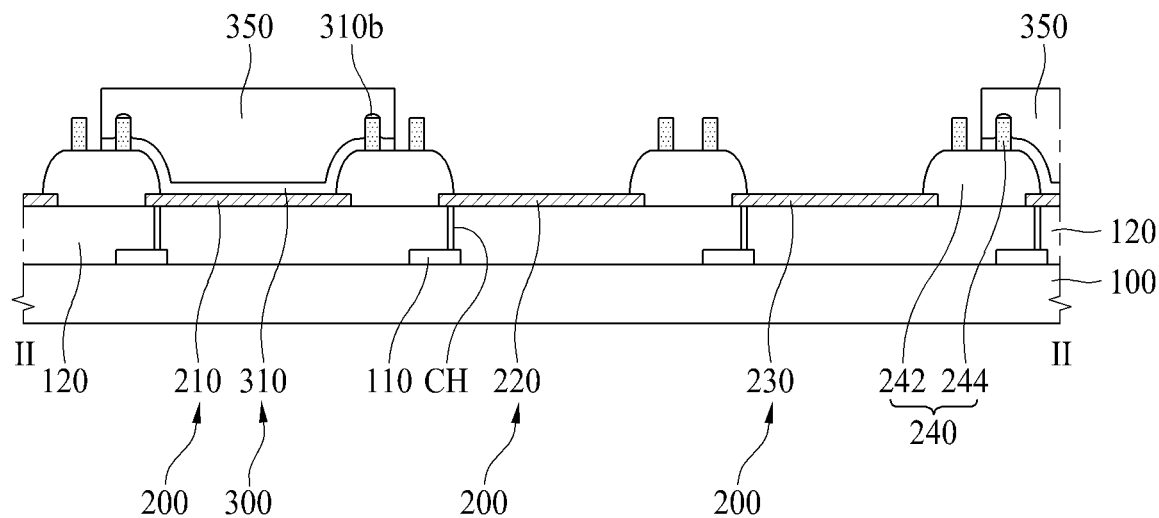

More specifically, the first light emitting layer 310 is formed on the first electrode 210 as illustrated in FIG. 13C. A first light emitting material is deposited on the first electrodes 210, 220, and 230 and the bank 240. A first shield layer is formed on the first light emitting material. A photoresist pattern is formed on the first shield layer. Here, the photoresist pattern is formed at positions at which a first subpixel SP1 is to be formed. The first shield layer which is not covered by the photoresist pattern is dry-etched to form a first shield pattern 350 and the first light emitting layer 310 as illustrated in FIG. 13C, and then the photoresist pattern is removed.

Then, a second light emitting layer 320 is formed in patterns (S1204).

Figure 13D:
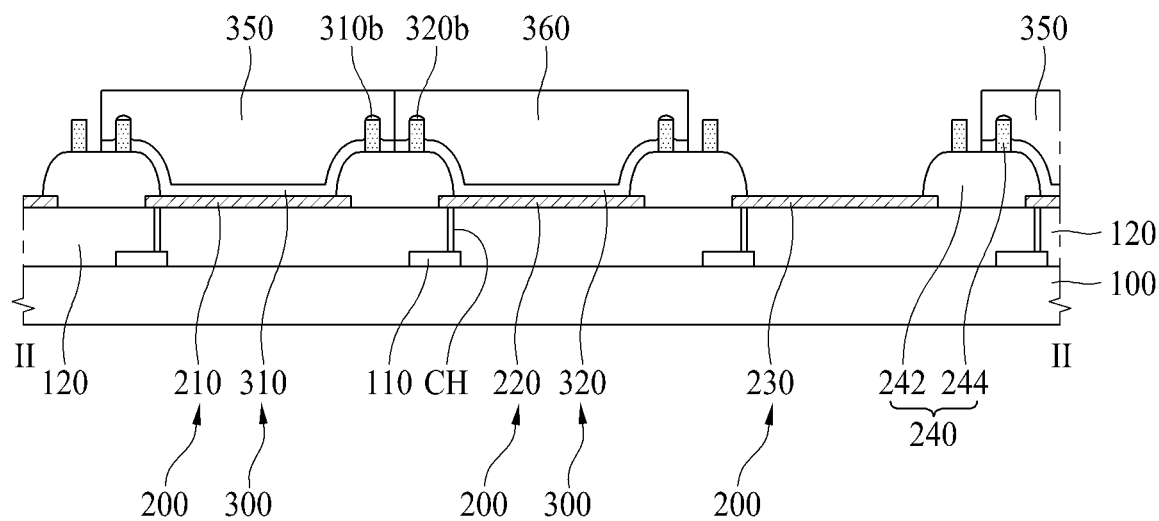

More specifically, the second light emitting layer 320 is formed on the first electrode 220 as illustrated in FIG. 13D. A second light emitting material is deposited on the first electrodes 210, 220, and 230 and the bank 240. A second shield layer is formed on the second light emitting material. A photoresist pattern is formed on the second shield layer. Here, the photoresist pattern is formed at positions at which a second subpixel SP2 is to be formed. The second shield layer which is not covered by the photoresist pattern is dry-etched to form a second shield pattern 360 and the second light emitting layer 320 as illustrated in FIG. 13D, and then the photoresist pattern is removed.

Then, a third light emitting layer 330 is formed in patterns (S1205).

Figure 13E:
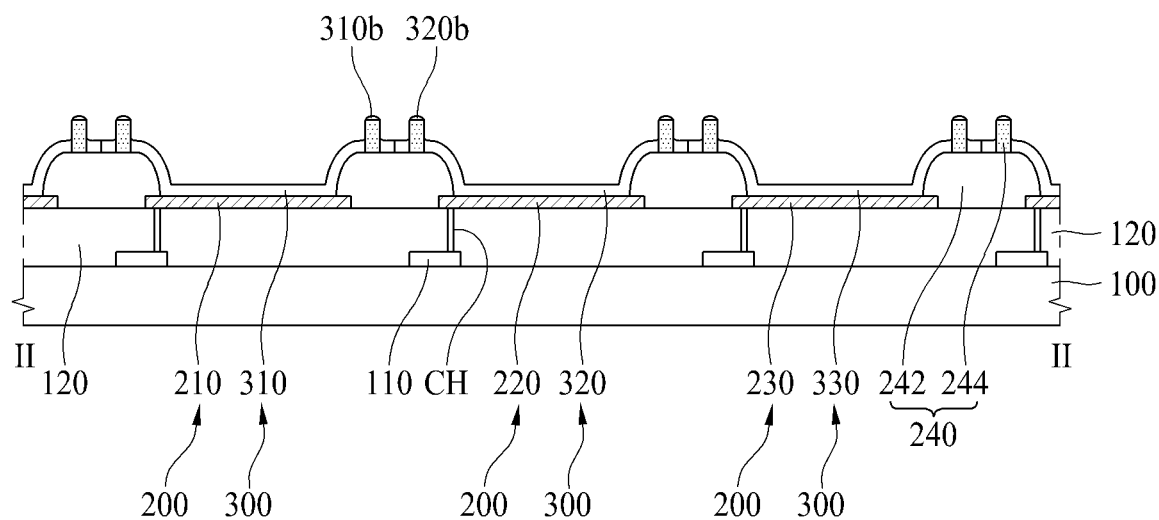
Figure 13F:
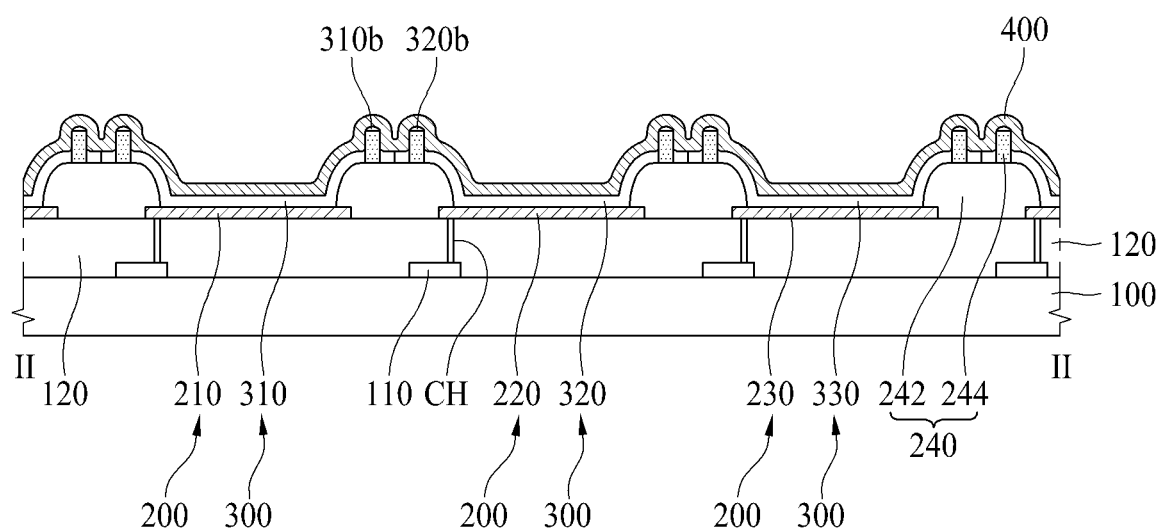

More specifically, the third light emitting layer 330 is formed on the first electrode 230 as illustrated in FIG. 13E. A third light emitting material is deposited on the first electrodes 210, 220, and 230 and the bank 240. Then, the first and second shield patterns 350 and 360 are removed.

Then, a second electrode 400 is formed (S1206).

More specifically, the second electrode 400 is formed on the first to third light emitting layers 310, 320, and 330. The second electrode 400 is formed of a transparent conductive material (TCO) such as ITO or IZO or a semi-transmissive conductive material such as magnesium (Mg), silver (Ag), or an alloy of magnesium (Mg) and silver (Ag). The second electrode 400 can be formed using a physical vapor deposition (PVD) method such as a sputtering method.

Then, an encapsulation film 500 is formed (S1207).

Figure 13G:
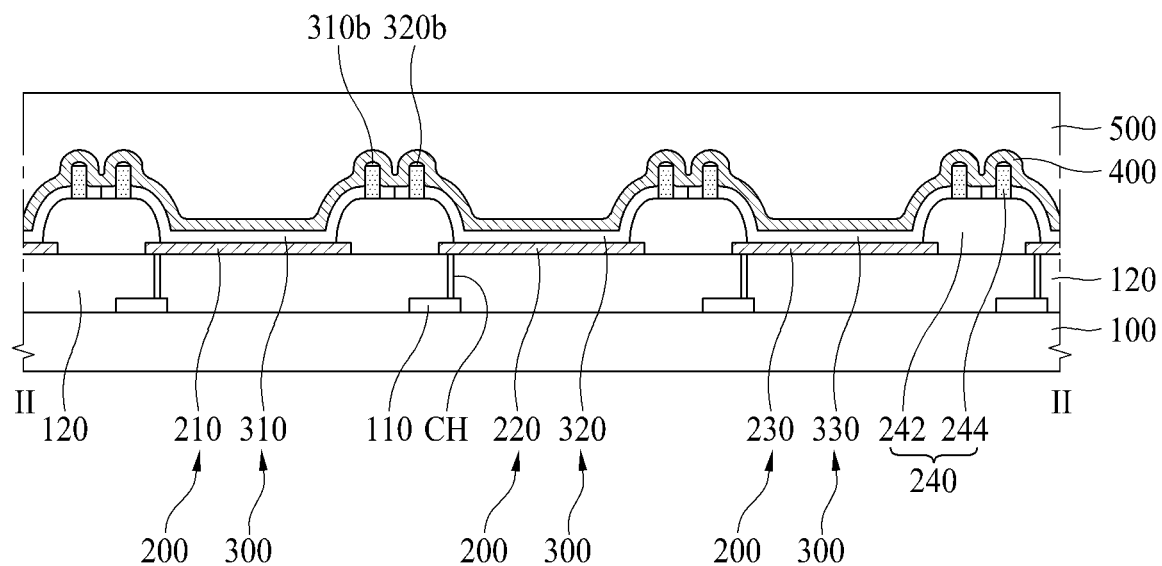
Figure 13H:
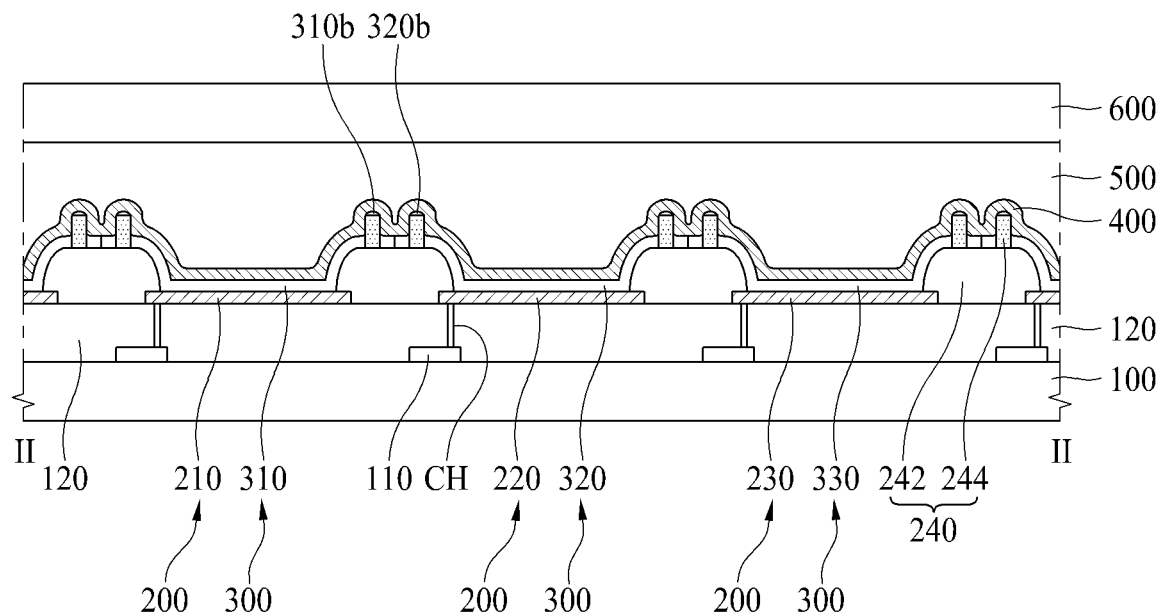

More specifically, the encapsulation film 500 is formed on the second electrode 400 as illustrated in FIG. 13G. The encapsulation film 500 includes a first inorganic film, an organic film, and a second inorganic film.

The first inorganic film is formed on the second electrode 400. The first inorganic film may be formed of silicon nitride, aluminum nitride, zirconium nitride, titanium nitride, hafnium nitride, tantalum nitride, silicon oxide, aluminum oxide, or titanium oxide. The first inorganic film may be formed using a chemical vapor deposition (CVD) method or an atomic layer deposition (ALD) method, but the present disclosure is not limited thereto.

Then, the organic film is formed on the first inorganic film. The organic film may be formed of, for example, an acryl resin, an epoxy resin, a phenolic resin, a polyamide resin, or a polyimide resin.

Then, the second inorganic film is formed on the organic film. The second inorganic film may be formed of silicon nitride, aluminum nitride, zirconium nitride, titanium nitride, hafnium nitride, tantalum nitride, silicon oxide, aluminum oxide, or titanium oxide. The second inorganic film may be formed using a chemical vapor deposition (CVD) method or an atomic layer deposition (ALD) method, but the present disclosure is not limited thereto.

Then, the first substrate 100 and the second substrate 600 are bonded to each other (S1208).

Figure 14A:
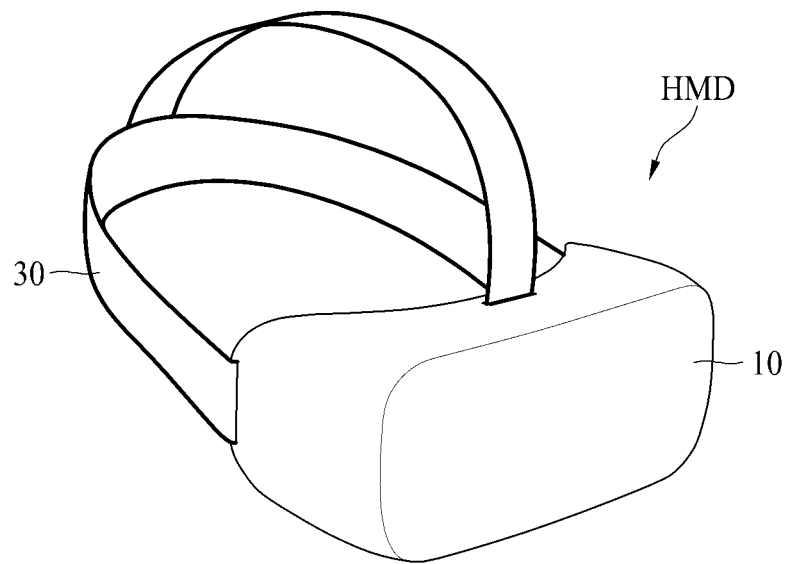
FIGS. 14A to 14C are diagrams illustrating a head-mounted display (HIVID) device which is a display device according to another embodiment of the present disclosure.
Figure 14B:
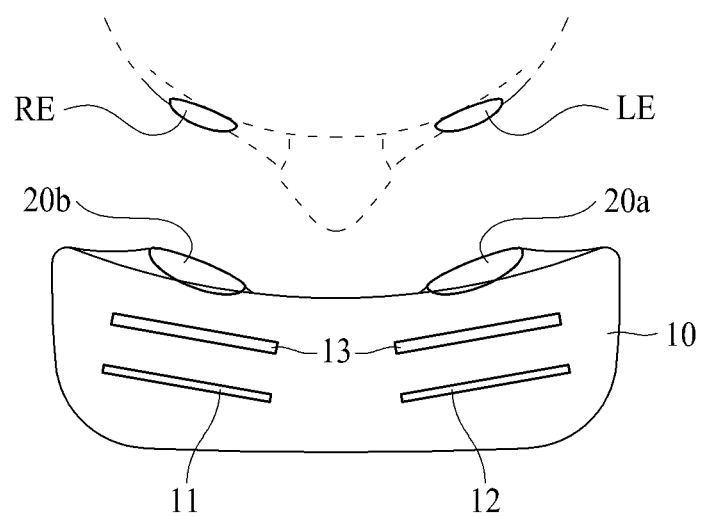
Figure 14C:
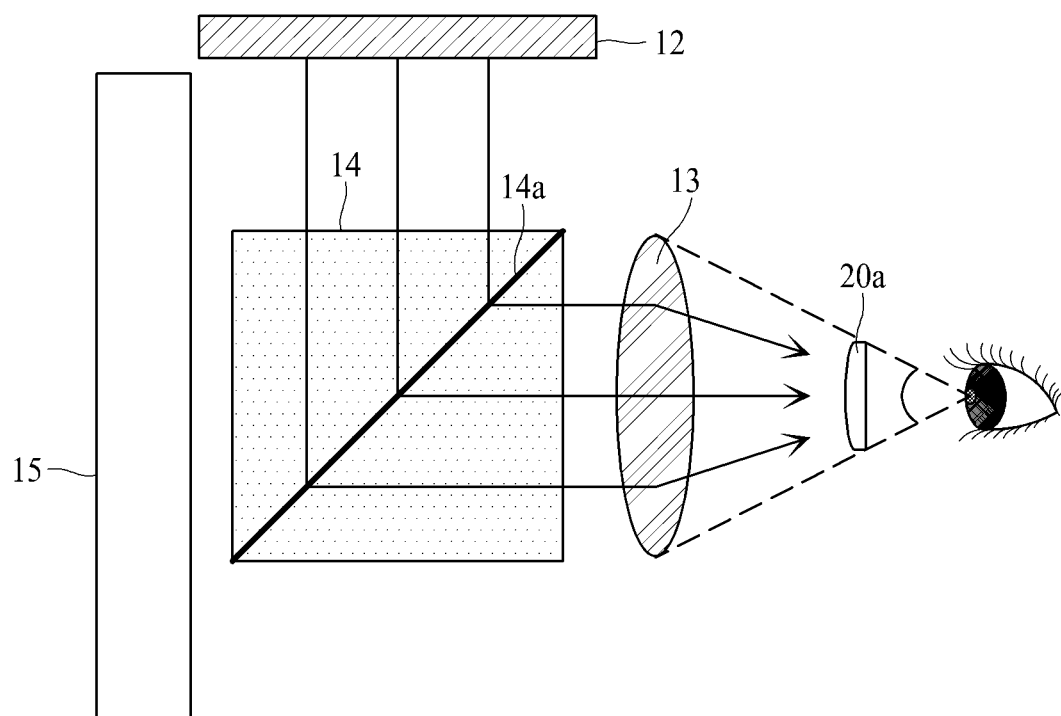

FIGS. 14A to 14C are diagrams illustrating a head-mounted display (HIVID) device which is a display device according to another embodiment of the present disclosure. FIG. 14A is a schematic perspective view, FIG. 14B is a schematic plan view of a virtual reality (VR) structure, and FIG. 14C is a schematic sectional view of an augmented reality (AR) structure.

As can be seen from FIG. 14A, the head-mounted display device according to the present disclosure includes a storage case 10 and a head-mounted band 30.

The storage case 10 stores elements such as a display device, a lens array, and an eyepiece therein.

The head-mounted band 30 is fixed to the storage case 10. The head-mounted band 30 is formed to surround the top surface and both side surfaces of a user's head, but the present disclosure is not limited thereto. The head-mounted band 30 is used to fix the head-mounted display device to a user's head and may be replaced with an eyeglass-shaped structure or a helmet-shaped structure.

As can be seen from FIG. 14B, the head-mounted display device for virtual reality (VR) according to the present disclosure includes a left-eye display device 12, a right-eye display device 11, lens arrays 13, a left-eye eyepiece 20a, and a right-eye eyepiece 20b.

The left-eye display device 12, the right-eye display device 11, the lens arrays 13, the left-eye eyepiece 20a, and the right-eye eyepiece 20b are stored in the storage case 10.

The left-eye display device 12 and the right-eye display device 11 can display the same image. In this case, a user can watch a 2D image. Alternatively, the left-eye display device 12 may display a left-eye image and the right-eye display device 11 may display a right-eye image. In this case, a user can watch a 3D image. Each of the left-eye display device 12 and the right-eye display device 11 may employ the display device illustrated in FIGS. 1 to 11. Here, an upper part corresponding to the surface on which an image is displayed, for example, the encapsulation film 500, in FIGS. 1 to 11 faces the lens array 13.

The lens array 13 may be separated from the left-eye eyepiece 20a and the left-eye display device 12 and be disposed between the left-eye eyepiece 20a and the left-eye display device 12. That is, the lens array 13 may be disposed before the left-eye eyepiece 20a and after the left-eye display device 12. The lens array 13 may be separated from the right-eye eyepiece 20b and the right-eye display device 11 and be disposed between the right-eye eyepiece 20b and the right-eye display device 11. That is, the lens array 13 may be disposed before the right-eye eyepiece 20b and after the right-eye display device 11.

The lens array 13 may be microlens arrays. In some embodiments, the lens array 13 may be replaced with a pin-hole array. An image which is displayed on the left-eye display device 12 or the right-eye display device 11 can be enlarged and displayed for a user by the lens array 13.

A user's left eye LE is located at the left-eye eyepiece 20a and the user's right eye RE is located at the right-eye eyepiece 20b.

As can be seen from FIG. 14C, the head-mounted display device for augmented reality (AR) according to the present disclosure includes a left-eye display device 12, a right-eye display device, a left-eye eyepiece 20a, a transmissive/reflective portion 14, and a transmission window 15. For the purpose of convenience, only a configuration on the left-eye side is illustrated in FIG. 14C, but a configuration on the right-eye side is the same as the configuration on the left-eye side.

The left-eye display device 12, the lens array 13, the left-eye eyepiece 20a, the transmissive/reflective portion 14, and the transmission window 15 are stored in the storage case 10.

The left-eye display device 12 may be disposed on one side of the transmissive/reflective portion 14, that is, an upper side, such that the transmission window 15 is not covered. Accordingly, the left-eye display device 12 can provide an image to the transmissive/reflective portion 14 while not covering the background through the transmission window 15.

The left-eye display device 12 may employ the display devices illustrated in FIGS. 1 to 11. Here, an upper part corresponding to the surface on which an image is displayed in FIGS. 1 to 15, for example, the color filter (not illustrated), faces the transmissive/reflective portion 14.

The lens array 13 is disposed between the left-eye eyepiece 20a and the transmissive/reflective portion 14.

A user's left eye is located at the left-eye eyepiece 20a.

The transmissive/reflective portion 14 is disposed between the lens array 13 and the transmission window 15. The transmissive/reflective portion 14 includes a reflective surface 14a that transmits some light and reflects other light. The reflective surface 14a is formed such that an image displayed on the left-eye display device 12 propagates to the lens array 13. Accordingly, a user can watch both an external background and an image which is displayed by the left-eye display device 12 through the transmission window 15. That is, a user can watch a single image in which a real background and a virtual image are superimposed and thus augmented reality (AR) can be realized.

The transmission window 15 is disposed before the transmissive/reflective portion 14.

The display device according to the present disclosure further provides a display device that includes: a substrate having thereon a first subpixel, a second subpixel, and a third subpixel; first electrodes in each of the first to third subpixels on the substrate; a first bank between the first electrodes, the first bank having a first width; a second bank on the first bank, the second bank having a second width that is less than the first width; a light emitting layer on the first electrodes, the first bank, and the second bank; and a second electrode on the light emitting layer.

In one embodiment, the light emitting layer provided on the second bank and the light emitting layer provided on the first bank are spaced apart from each other.

In one embodiment, an angle which is formed by a bottom surface of the second bank in contact with a top surface of the first bank and a side surface of the second bank is equal to or greater than 90 degrees.

In one embodiment, the second bank laterally surrounds each of the first to third subpixels.

In one embodiment, the second bank has a height which is greater than 3000 Å.

In one embodiment, the second bank includes at least one bank pattern that is provided between two neighboring subpixels.

In one embodiment, the second bank includes a plurality of bank patterns, the plurality of bank patterns being separated from each other.

In one embodiment, the first bank is formed of an inorganic material.

In one embodiment, the second bank is formed of a metal material.

In one embodiment, the second bank is formed of an inorganic material.

The display device further includes a third bank provided on the second bank and formed of a metal material.

In one embodiment, the light emitting layer includes: a first light emitting layer in the first subpixel and configured to emit light of a first color; a second light emitting layer in the second subpixel and configured to emit light of a second color; and a third light emitting layer in the third subpixel and configured to emit light of a third color.

In one embodiment, each of the first light emitting layer, the second light emitting layer, and the third light emitting layer includes: a light emitting portion provided between the first electrode and the second electrode and including an emission area emitting light; a first light non-emitting portion on the second bank that does not emit light; and a second light non-emitting portion on the first bank on which the second bank is not formed that does not emit light.

In one embodiment, the first light non-emitting portion and the second light non-emitting portion are separated from each other.

In one embodiment, the light emitting portion and the first light non-emitting portion are separated from each other.

Another aspect of the display device according to the present disclosure includes: a substrate having thereon a plurality of pixels, the plurality of pixels including a first subpixel, a second subpixel, and a third subpixel; a first electrode in each of the first to third subpixels on the substrate; a first bank that between the first electrodes; a second bank on the first bank; a light emitting layer on the first electrodes, the first bank, and the second bank; and a second electrode on the light emitting layer.

In one embodiment, the first subpixel, the second subpixel, and the third subpixel each have different shapes.

In one embodiment, the second bank has a width which is less than that of the first bank.

In one embodiment, an angle which is formed by a bottom surface of the second bank in contact with a top surface of the first bank and a side surface of the second bank is equal to or greater than 90 degrees.

In one embodiment, the second bank surrounds each of the first to third subpixels.

In one embodiment, the light emitting layer includes: a light emitting portion between the first electrode and the second electrode, the light emitting portion including an emission area emitting light; a first light non-emitting portion on the second bank that does not emit light; and a second light non-emitting portion on the first bank on which the second bank is not formed that does not emit light.

In one embodiment, the light emitting portion and the first light non-emitting portion or the first light non-emitting portion and the second light non-emitting portion are separated from each other.

In one embodiment, the second subpixel has a shape that surrounds the first subpixel and the third subpixel has a shape that surrounds the second subpixel.

In one embodiment, the plurality of pixels include a first pixel, a second pixel that is adjacent to the first pixel in a first direction, and a third pixel that is adjacent to the second pixel in the first direction.

In one embodiment, the first subpixel, the second subpixel, and the third subpixel which are included in each of the first pixel, the second pixel, and the third pixel have different shapes.

In one embodiment, the first pixel has a shape in which the second subpixel laterally surrounds the first subpixel and the third subpixel laterally surrounds the second subpixel.

In one embodiment, the second pixel has a shape in which the third subpixel laterally surrounds the second subpixel and the first subpixel laterally surrounds the third subpixel.

In one embodiment, the third pixel has a shape in which the first subpixel laterally surrounds the third subpixel and the second subpixel laterally surrounds the first subpixel.

In one embodiment, a total area of the first subpixels included in the first pixel, the second pixel, and the third pixel, a total area of the second subpixels included in the first pixel, the second pixel, and the third pixel, and a total area of the third subpixels included in the first pixel, the second pixel, and the third pixel are the same.

While embodiments of the present disclosure have been described above in detail in conjunction with the accompanying drawings, the present disclosure is not limited to the embodiments and can be modified and implemented in various forms without departing from the technical spirit of the present disclosure. Accordingly, the embodiments disclosed in the present disclosure are not for limiting the technical spirit of the present disclosure but for explaining it, and the scope of the technical spirit of the present disclosure is not limited by the embodiments. Therefore, the above-mentioned embodiments should be understood to be exemplary, not definitive, in all respects.

The various embodiments described above can be combined to provide further embodiments. Further changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a substrate having thereon a first subpixel, a second subpixel, and a third subpixel;
   first electrodes in each of the first to third subpixels on the substrate;
   a first bank between the first electrodes, the first bank having a first width;
   a second bank on the first bank, the second bank having a second width that is less than the first width;
   a third bank provided on the second bank and covering a top and whole side surfaces of the second bank;
   a light emitting layer on the first electrodes, the first bank, and the second bank; and
   a second electrode on the light emitting layer,
   wherein the light emitting layer provided on the second bank and the light emitting layer provided on the first bank are spaced apart from each other,
   wherein the second bank includes a plurality of bank patterns that is provided between two neighboring subpixels,
   wherein the second bank is located at a top surface of the first bank,
   wherein the light emitting layer includes:
      a first light emitting layer in the first subpixel and configured to emit light of a first color;
      a second light emitting layer in the second subpixel and configured to emit light of a second color; and
      a third light emitting layer in the third subpixel and configured to emit light of a third color,
   wherein each of the first light emitting layer, the second light emitting layer, and the third light emitting layer includes:
      a light emitting portion provided between the first electrode and the second electrode and including an emission area emitting light;
      a first light non-emitting portion on the second bank that does not emit light; and
      a second light non-emitting portion on the first bank on which the second bank is not formed that does not emit light, and
   wherein the first light non-emitting portion and the second light non-emitting portion are separated from each other.

2. The display device according to claim 1, wherein an angle which is formed by a bottom surface of the second bank in contact with the top surface of the first bank and a side surface of the second bank is equal to or greater than 90 degrees.

3. The display device according to claim 1, wherein the second bank laterally surrounds each of the first to third subpixels.

4. The display device according to claim 1, wherein the second bank has a height which is greater than 3000 Å.

5. The display device according to claim 1, wherein the second bank includes a plurality of bank patterns, the plurality of bank patterns being separated from each other.

6. The display device according to claim 1, wherein the first bank is formed of an inorganic material.

7. The display device according to claim 1, wherein the second bank is formed of a metal material.

8. The display device according to claim 1, wherein the second bank is formed of an inorganic material.

9. The display device according to claim 8, wherein the third bank provided on the second bank and formed of a metal material.

10. The display device according to claim 1, wherein the light emitting portion and the first light non-emitting portion are separated from each other.

11. A display device, comprising:
   a substrate having thereon a plurality of pixels, the plurality of pixels including a first subpixel, a second subpixel, and a third subpixel;
   a first electrode in each of the first to third subpixels on the substrate;
   a first bank that between the first electrode;
   a second bank on the first bank;
   a light emitting layer on the first electrode, the first bank, and the second bank; and
   a second electrode on the light emitting layer,
   wherein the first subpixel, the second subpixel, and the third subpixel each have different shapes, wherein the light emitting layer includes:
- a first light emitting layer in the first subpixel, a second light emitting layer in the second subpixel and a third light emitting layer in the third subpixel, each of the first to third light emitting layers including:
  - a light emitting portion provided between the first electrode and the second electrode and including an emission area emitting light;
  - a first light non-emitting portion on the second bank, the first light non-emitting portion not being configured to emit light; and
  - a second light non-emitting portion on the first bank on which the second bank is not formed, the second light non-emitting portion not being configured to emit light,
  - wherein the first light non-emitting portion and the second light non-emitting portion are separated from each other, and
  - wherein the first light non-emitting portions of two neighboring subpixels stacked each other on the second bank.

12. The display device according to claim 11, wherein the second bank has a width which is less than that of the first bank.

13. The display device according to claim 11, wherein an angle which is formed by a bottom surface of the second bank in contact with a top surface of the first bank and a side surface of the second bank is equal to or greater than 90 degrees.

14. The display device according to claim 11, wherein the second bank surrounds each of the first to third subpixels.

15. The display device according to claim 11, wherein the second subpixel has a shape that surrounds the first subpixel and the third subpixel has a shape that surrounds the second subpixel.

16. The display device according to claim 11, wherein the plurality of pixels include a first pixel, a second pixel that is adjacent to the first pixel in a first direction, and a third pixel that is adjacent to the second pixel in the first direction, and
wherein the first subpixel, the second subpixel, and the third subpixel which are included in each of the first pixel, the second pixel, and the third pixel have different shapes.

17. The display device according to claim 16, wherein the first pixel has a shape in which the second subpixel laterally surrounds the first subpixel and the third subpixel laterally surrounds the second subpixel,
wherein the second pixel has a shape in which the third subpixel laterally surrounds the second subpixel and the first subpixel laterally surrounds the third subpixel, and
wherein the third pixel has a shape in which the first subpixel laterally surrounds the third subpixel and the second subpixel laterally surrounds the first subpixel.

18. The display device according to claim 16, wherein a total area of the first subpixels included in the first pixel, the second pixel, and the third pixel, a total area of the second subpixels included in the first pixel, the second pixel, and the third pixel, and a total area of the third subpixels included in the first pixel, the second pixel, and the third pixel are the same.

* * * * *